United States Patent
Drewery

(10) Patent No.: US 9,934,956 B2
(45) Date of Patent: Apr. 3, 2018

(54) TIME MULTIPLEXED CHEMICAL DELIVERY SYSTEM

(71) Applicant: Lam Research Corporation, Fremont, CA (US)

(72) Inventor: John Drewery, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 124 days.

(21) Appl. No.: 14/832,824

(22) Filed: Aug. 21, 2015

(65) Prior Publication Data

US 2017/0031370 A1 Feb. 2, 2017

Related U.S. Application Data

(60) Provisional application No. 62/197,243, filed on Jul. 27, 2015.

(51) Int. Cl.
  *F16K 11/20* (2006.01)
  *H01L 21/00* (2006.01)
  *G05D 7/06* (2006.01)

(52) U.S. Cl.
  CPC ........... *H01L 21/00* (2013.01); *G05D 7/0641* (2013.01); *Y10T 137/87249* (2015.04)

(58) Field of Classification Search
  CPC ......... Y10T 137/87249; Y10T 137/877; Y10T 137/87917; Y10T 137/7761; Y10T 137/2705; G05D 7/0623; G05D 7/0664; G05D 11/132; C23C 16/45561
  See application file for complete search history.

(56) References Cited

U.S. PATENT DOCUMENTS

| | | | | |
|---|---|---|---|---|
| 7,673,645 B2* | 3/2010 | Ding | ................... | G05D 11/132 137/487.5 |
| 2002/0185185 A1* | 12/2002 | Yamaji | .................. | F16K 27/003 137/884 |
| 2004/0168719 A1* | 9/2004 | Nambu | ................ | G05D 7/0664 137/87.04 |
| 2006/0237063 A1* | 10/2006 | Ding | ................... | G05D 11/132 137/487.5 |
| 2007/0175391 A1* | 8/2007 | Mizusawa | ............. | C23C 16/455 118/689 |

(Continued)

*Primary Examiner* — Jessica Cahill
(74) *Attorney, Agent, or Firm* — Martine Penilla Group, LLP

(57) ABSTRACT

A gas delivery system delivers different process gas compositions to a common supply line at specified times. Multiple reservoirs are fluidly connected to the common supply line with each reservoir having its own charge control valve for controlling connection of the reservoir to the common supply line. Each of the multiple reservoirs has a corresponding mass flow controller and delivery control valve connected to control flow of process gas from within the reservoir to a process module at specified times. The common supply line is operated to fill the multiple reservoirs with different process gas compositions in a time-divided manner. The mass flow controllers and delivery control valves of the multiple reservoirs are operated to deliver one or more process gas compositions to the process module in an accurately timed manner in accordance with a prescribed schedule. The multiple reservoirs are filled as needed to satisfy the prescribed schedule.

25 Claims, 10 Drawing Sheets

(56) References Cited

U.S. PATENT DOCUMENTS

| | | | |
|---|---|---|---|
| 2007/0175392 A1* | 8/2007 | Znamensky | C23C 16/448 118/715 |
| 2008/0223455 A1* | 9/2008 | Fukuhara | C23C 16/45557 137/488 |
| 2009/0019943 A1* | 1/2009 | Ozawa | G01F 1/383 73/861 |
| 2011/0135821 A1* | 6/2011 | Ding | C23C 16/45557 427/248.1 |
| 2013/0255782 A1* | 10/2013 | Shareef | F17D 1/00 137/1 |
| 2014/0033828 A1* | 2/2014 | Larson | G01F 1/36 73/861.61 |
| 2014/0053912 A1* | 2/2014 | Gregor | G05D 16/2006 137/12 |
| 2014/0096834 A1* | 4/2014 | Slevin | C23C 16/4402 137/1 |

* cited by examiner

TIME MULTIPLEXED CHEMICAL DELIVERY SYSTEM

CLAIM OF PRIORITY

This application claims priority under 35 U.S.C. 119(e) to U.S. Provisional Patent Application No. 62/197,243, filed Jul. 27, 2015, the disclosure of which is incorporated herein by reference in its entirety.

BACKGROUND

1. Field of the Invention

The present invention relates to semiconductor device fabrication.

2. Description of the Related Art

Some modern semiconductor device fabrication procedures utilize multiple process gas compositions where in-process changes between different applied process gas compositions are required to be made quickly and accurately. Rapid process gas composition switching is an operation performed during a semiconductor device fabrication procedure in which the flow of process gas compositions into a process module, e.g., into a plasma processing chamber, is changed with high timing precision. Rapid process gas switching can require changing of the process gas composition delivered to the process module within a time period of less than about 1 second, and in some cases even within a time period of less than about 0.1 second. The process gas composition switching time should be accurate in comparison with a clock, and in some cases in accordance with a processing recipe. For example, if a processing recipe indicates that a particular process gas composition transition should occur 20 seconds into the processing recipe (or at a nominal step transition time), the process gas composition transition should occur between 19.9 seconds and 20.1 seconds into the processing recipe. Most semiconductor device fabrication systems are not able to approach this level of timing precision with regard to process gas composition transition. It is within this context that the present invention arises.

SUMMARY

In one example embodiment, a gas supply system for a process module is disclosed. The gas delivery system is configured to deliver different process gas compositions at specified times. A common supply line is fluidly connected to the gas delivery system such that a given process gas composition delivered by the gas delivery system at a given time is flowed through the common supply line. Each of a plurality of reservoirs is fluidly connected to the common supply line. A plurality of charge control valves respectively correspond to the plurality of reservoirs. Each of the plurality of charge control valves is connected to control starting and stopping of gas flow from the common supply line to its corresponding reservoir. A plurality of mass flow controllers respectively correspond to the plurality of reservoirs. Each of the plurality of mass flow controllers is connected to control a flow rate of gas delivered from an outlet of its corresponding reservoir. A plurality of delivery control valves respectively correspond to the plurality of mass flow controllers. Each of the plurality of delivery control valves is connected to control starting and stopping of gas flow from an outlet of its corresponding mass flow controller to the process module.

In one example embodiment, a method is disclosed for supplying process gas compositions to a process module. The method includes delivering a first process gas composition to a common supply line. The method includes connecting a first reservoir to the common supply line such that the first process gas composition flows into the first reservoir from the common supply line. The method includes delivering the first process gas composition from the first reservoir through a first mass flow controller to the process module. The method includes isolating the first reservoir from the common supply line while continuing to deliver the first process gas composition from the first reservoir through the first mass flow controller to the process module. The method includes delivering a second process gas composition to the common supply line while continuing to deliver the first process gas composition from the first reservoir through the first mass flow controller to the process module. The method includes connecting a second reservoir to the common supply line such that the second process gas composition flows into the second reservoir from the common supply line while continuing to deliver the first process gas composition from the first reservoir through the first mass flow controller to the process module. The method includes stopping delivery of the first process gas composition from the first reservoir through the first mass flow controller to the process module. The method includes delivering the second process gas composition from the second reservoir through a second mass flow controller to the process module.

In one example embodiment, a method is disclosed for calibrating a gas supply system. The method includes determining an actual total flow rate of a process gas composition into a common supply line, wherein the process gas composition flows through the common supply line to a reservoir. The method includes measuring a total flow rate of the process gas composition within the common supply line using a mass flow meter configured with equivalent mass flow measurement technology as present within a mass flow controller connected to control delivery of process gas from the reservoir to a process module. Neither the mass flow meter nor the mass flow controller is calibrated for accurate measurement of flow rate of the process gas composition. The method includes determining a calibration adjustment factor for the mass flow controller by comparing the total flow rate of the process gas composition within the common supply line as measured by the mass flow meter to the actual total flow rate of the process gas composition into the common supply line. The method includes operating the mass flow controller to measure a flow rate of the process gas composition through the mass flow controller. The method includes applying the calibration adjustment factor determined for the mass flow controller for the process gas composition to the flow rate of the process gas composition as measured by the mass flow controller so as to obtain an accurate measure of the flow rate of the process gas composition through the mass flow controller and so as to enable use of the mass flow controller to accurately control the flow rate of the process gas composition to the process module.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Systems and methods are disclosed herein to provide for rapid switching of process gas compositions flowing to a process module used in fabrication of semiconductor devices, such as to plasma-based etching and/or deposition process modules, among others. The systems and methods disclosed herein provide for essentially instantaneous switching and/or alternating of any process gas composition delivered to a process module from a gas delivery system with another process gas composition deliverable from the same gas delivery system. A single delivery line, i.e., common supply line, from the gas delivery system is time-shared/time-divided to enable the essentially instantaneous switching and/or alternating of the process gas composition delivered to the process module. The systems and methods disclosed herein also provide for accurate control of the flow of process gas compositions to the process module, even when the composition of the delivered process gas/gas mixture changes in accordance with the essentially instantaneous switching and/or alternating of the process gas composition delivered to the process module.

Figure 1:
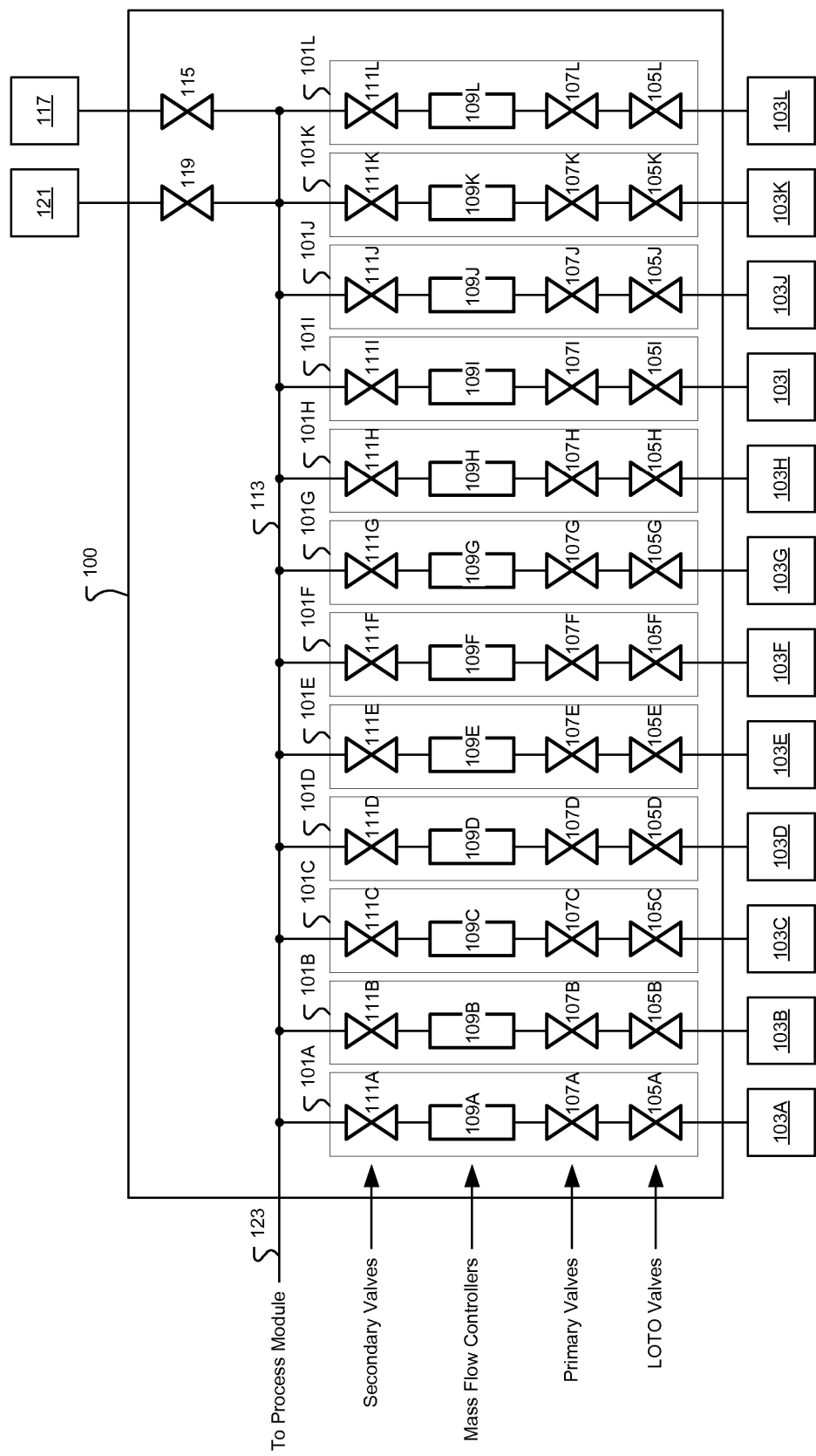
FIG. 1 shows a gas delivery system that can be used to supply process gas compositions to a process module, in accordance with some embodiments of the present invention.

FIG. 1 shows a gas delivery system 100 that can be used to supply process gas compositions to a process module, in accordance with some embodiments of the present invention. The gas delivery system 100 includes a number of gas delivery sticks 101A-101L. It should be understood that the number of gas delivery sticks 101A-101L depicted in FIG. 1 is shown by way of example. In other embodiments, the gas delivery system 100 can include a different number of gas delivery sticks. Each gas delivery stick 101A-101L includes a lock-out/tag-out (LOTO) valve 105A-105L, respectively, a primary shutoff valve 107A-107L, respectively, a mass flow controller 109A-109L, respectively, and a secondary shutoff valve 111A-111L, respectively. Each mass flow controller 109A-109L can be given its own flow set point. Each of the LOTO valves 105A-105L has an input side plumbed to a gas supply 103A-103L, respectively. Although the example of FIG. 1 shows each gas delivery stick 101A-101L plumbed to a different gas supply 103A-103L, it should be understood that in other embodiments some of the gas delivery sticks 101A-101L can be plumbed to share one or more of the gas supplies 103A-103L. Each of the secondary valves 111A-111L has an output side plumbed to a common manifold 113. The common manifold 113 is in turn connected to a delivery line 123 which is plumbed to supply the process gas composition from the gas delivery system 100 to the process module.

Also, the gas delivery system 100 includes a purge valve 115 having an input side plumbed to a purge gas supply 117 and an output side plumbed to the common manifold 113. With this configuration, the purge valve 115 can be operated to flow a purge gas through the common manifold 113, the delivery line 123, and/or the gas delivery sticks 101A-101L. The purge value 115 and purge gas supply 117 provide for cycle purging of the common manifold 113 and gas delivery sticks 101A-101L so that they may be safely serviced. Also, the gas delivery system 100 includes an evacuation valve 119 having an input side plumbed to the common manifold 113 and an output side plumbed to a vacuum source 121. With this configuration, the evacuation valve 119 can be operated to evacuate the common manifold 113, the delivery line 123, and/or the gas delivery sticks 101A-101L. Additionally, because of the toxicity and flammability of some process gas compositions, the components of the gas delivery system 100 can be contained in a purged enclosure with air drawn into the enclosure from outside and passed to exhaust ducting such that users will not be exposed to leaking gases. Also, pressure switches and other devices can be used to provide safety interlocks to ensure that the gas delivery system 100 switches to a safe state in the event of an anomalous condition. The gas delivery system 100 can be used to supply process gas compositions to many different types of semiconductor device fabrication process modules, including but not limited to plasma process modules for plasma induced/assisted etching and/or deposition processes.

Because of delays associated with the operation of the mass flow controllers and valves of the gas delivery sticks 101A-101L, and because it takes time for the process gas composition to flow down the delivery line(s) 123 to the process modules, the gas delivery system 100 is limited to providing changes in process gas composition at the process module on the order of a few seconds after the prescribed process gas composition transition time. Therefore, the gas delivery system 100 alone may not be equipped to deliver specified process gas compositions in accordance with high timing precision on the order of 1 second or less as may be required for rapid process gas switching operations during semiconductor device fabrication procedures. Also, with the gas delivery system 100 of FIG. 1, when the processing parameters need to change, the radiofrequency (RF) power will be turned off, then the new process gas composition flow will be initialized and stabilized within the delivery line 123, then the RF power will be turned back on. This is called a stability step, and may take several seconds. Many stability steps in a plasma process utilizing the gas delivery system 100 of FIG. 1 can accumulate into a significant amount of time, which extends the overall duration of the plasma processing and adversely affects fabrication throughput.

Figure 2:
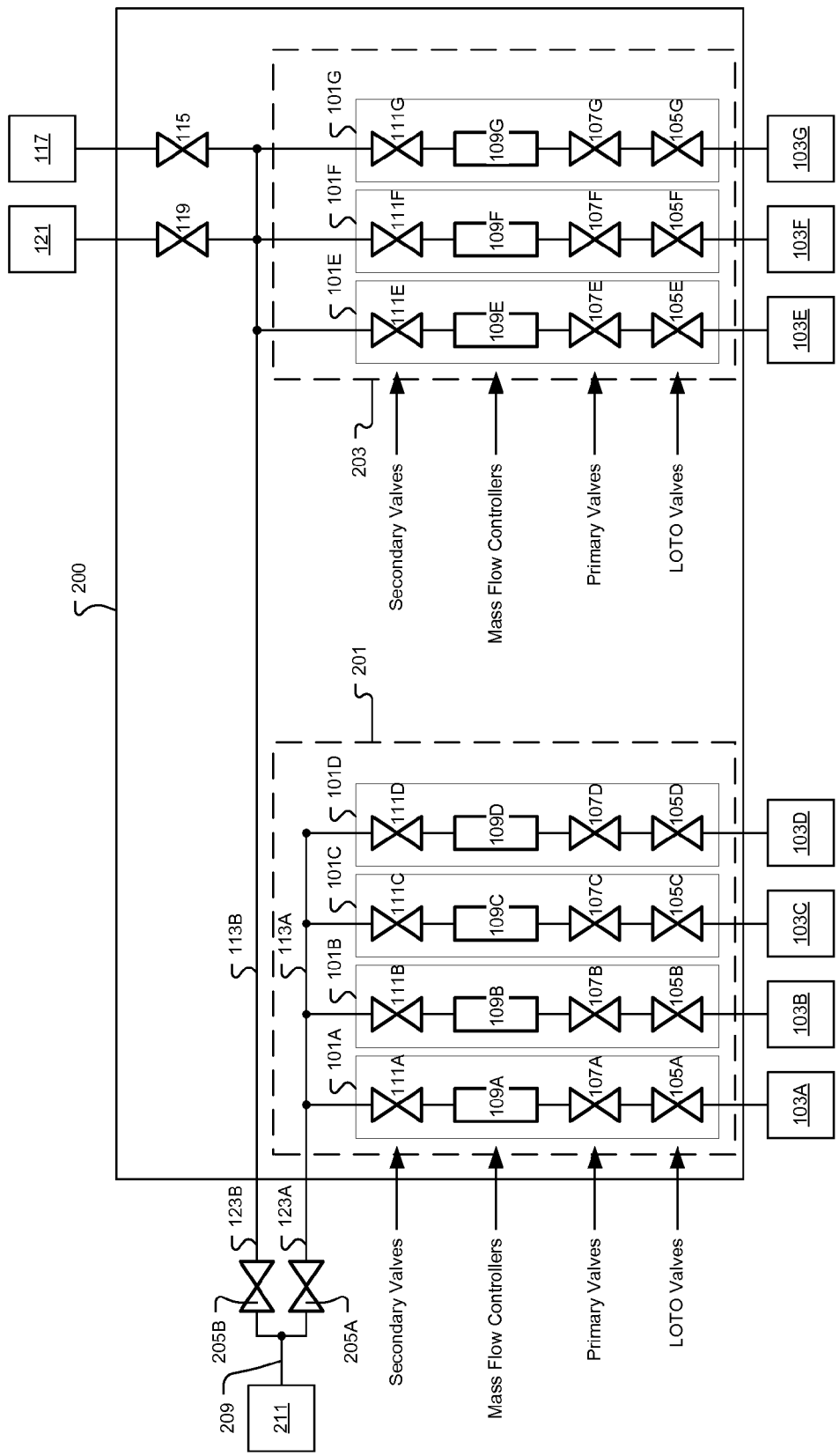
FIG. 2 shows a gas delivery system that can be used for a specific RAP or ALD process that utilizes two specific process gas compositions.

In the field of plasma-based etching, rapid alternating processing (RAP) relies on process step durations of less than 0.5 second. In the field of plasma-based deposition, atomic layer deposition (ALD) processes include step durations of less than 0.5 second. FIG. 2 shows a gas delivery system 200 that can be used for a specific RAP or ALD process that utilizes two specific process gas compositions. The gas delivery system 200 is a modified version of the gas delivery system 100 previously described with regard to FIG. 1. The gas delivery system 200 includes two sets of mass flow controllers, with each set of mass flow controllers connected to one of a pair of exit manifolds, and with two delivery lines to the process module that are terminated by valves enabling process gas composition flow to be delivered from each manifold successively. Specifically, in the gas delivery system 200, the gas delivery sticks are separated into two groups, with a first group of gas delivery sticks 201 dedicated to delivering a first process gas composition, and a second group of gas delivery sticks 203 dedicated to delivering a second process gas composition. In the example of FIG. 2, the first group of gas delivery sticks 201 includes gas delivery sticks 101A-101D, and the second group of gas delivery sticks 203 includes gas delivery sticks 101E-101G. Each gas delivery stick 101A-101G includes a LOTO valve 105A-105G, respectively, a primary shutoff valve 107A-107G, respectively, a mass flow controller 109A-109G, respectively, and a secondary shutoff valve 111A-111G, respectively. Each of the LOTO valves 105A-105G has an input side plumbed to a gas supply 103A-103G, respectively. Although the example of FIG. 2 shows each gas delivery stick 101A-101G plumbed to a different gas supply 103A-103G, it should be understood that in other embodiments different gas delivery sticks 101A-101G can be plumbed to share one or more of the gas supplies 103A-103G.

Each of the secondary valves 111A-111D of the first group of gas delivery sticks 201 has an output side plumbed to a first common manifold 113A. The first common manifold 113A is in turn plumbed to a first delivery line 123A which is in turn plumbed to an inlet side of a first control valve 205A. An outlet side of the first control valve 205A is plumbed to a supply line 209 of a process module 211. The first control valve 205A is calibrated specifically for the first process gas composition. Therefore, the first control valve 205A cannot be reliably used to control the flow of a different process gas composition as compared to the first process gas composition. Operation of the first control valve 205A controls flow of the first process gas composition from the first delivery line 123A to the process module 211. Similarly, each of the secondary valves 111E-111G of the second group of gas delivery sticks 203 has an output side plumbed to a second common manifold 113B. The second common manifold 113B is in turn plumbed to a second delivery line 123B which is in turn plumbed to an inlet side of a second control valve 205B. The second control valve 205B is calibrated specifically for the second process gas composition. Therefore, the second control valve 205B cannot be reliably used to control the flow of a different process gas composition as compared to the second process gas composition. An outlet side of the second control valve 205B is plumbed to the supply line 209 of the process module 211. Operation of the second control valve 205B controls flow of the first process gas composition from the second delivery line 123B to the process module 211. The control valves 205A and 205B are positioned close to the process module 211 to provide for rapid changing from supply of the first process gas composition to the second process gas composition, vice-versa.

The gas delivery system 200 also includes a first purge valve 115A having an input side plumbed to the purge gas supply 117 and an output side plumbed to the first common manifold 113A. With this configuration, the first purge valve 115A can be operated to flow a purge gas through the first common manifold 113A, the first delivery line 123A, and/or the first group of gas delivery sticks 101A-101D. The first purge valve 115A and the purge gas supply 117 provide for cycle purging of the first common manifold 113A and gas delivery sticks 101A-101D so that they may be safely serviced. Also, the gas delivery system 200 includes a first evacuation valve 119A having an input side plumbed to the first common manifold 113A and an output side plumbed to the vacuum source 121. With this configuration, the first evacuation valve 119A can be operated to evacuate the first common manifold 113A, the first delivery line 123A, and/or the first group of gas delivery sticks 101A-101D.

The gas delivery system 200 also includes a second purge valve 115B having an input side plumbed to the purge gas supply 117 and an output side plumbed to the second common manifold 113B. With this configuration, the second purge valve 115B can be operated to flow a purge gas through the second common manifold 113B, the second delivery line 123B, and/or the second group of gas delivery sticks 101E-101G. The second purge valve 115B and the purge gas supply 117 provide for cycle purging of the second common manifold 113B and gas delivery sticks 101E-101G so that they may be safely serviced. Also, the gas delivery system 200 includes a second evacuation valve 119B having an input side plumbed to the second common manifold 113B and an output side plumbed to the vacuum source 121. With this configuration, the second evacuation valve 119B can be operated to evacuate the second common manifold 113B, the second delivery line 123B, and/or the second group of gas delivery sticks 101E-101G.

Additionally, because of the toxicity and flammability of some process gases, the components of the gas delivery system 200 can be contained in a purged enclosure with air drawn into the enclosure from outside and passed to exhaust ducting such that users will not be exposed to leaking gases. Also, pressure switches and other devices can be used to provide safety interlocks to ensure that the gas delivery system 200 switches to a safe state in the event of an anomalous condition. The gas delivery system 200 can be used to supply process gas compositions to many different types of semiconductor device fabrication process modules, including but not limited to plasma process modules for plasma induced/assisted etching and/or deposition processes.

In RAP and ALD processes, a limited number of process gas compositions are used. Therefore, the gas delivery system 200 of FIG. 2 may be a viable option for the RAP and ALD processes. For example, in some RAP and/or ALD processes, a process step that uses a first process gas composition A can be alternated with a process step that uses a second process gas composition B by using the first group of gas delivery sticks 101A-101D for delivery of the first process gas composition and by using the second group of gas delivery sticks 101E-101G for the delivery of the second process gas composition. In this situation, the plasma processing systems are highly specialized for running a specific plasma-based process, and the first and second process gas compositions A and B are predictable essentially at the time the process module and supporting systems are designed, which enables the specialized design of the plasma processing systems.

As shown in FIG. 2 the first and second process gas compositions A and B are delivered by separate routes 113A/123A and 113B/123B to control valves 205A and 205B, which are located close to the process module 211. The process gas composition handling components in the gas delivery system 200 are specified to have tightly controlled timing performance on the order of less than 10 milliseconds for a state transition. Additionally, the gas delivery system 200 can be designed and installed such that process gas composition transit delays from the gas delivery system 200 to the process module are small.

In the field of plasma-based etching for semiconductor device fabrication, a very large number of process gas compositions, i.e., chemistries, may be involved. Plasma processing modules are expected to be able to run a large number of processes instead of being specialized towards any given process. As a result, modern plasma-based etching process modules may connected to a gas delivery system that can supply about 20 gas different process gas compositions, or even more. Also, demands for short, well-controlled, process steps are increasing in plasma-based etching processes. Step times have reduced from 20 seconds or greater (before about 2008) to 5 seconds or less in 2015 and are expected to approach 1-2 seconds and lower in the near future. Unfortunately, an approach similar to that used for RAP or ALD processing, such as depicted by the gas delivery system 200 of FIG. 2, is not suitable for the more complex plasma-based etching processes and associated tools, because (a) the size of the process gas composition delivery/handling system precludes its location close to the process module entrance, and (b) process gas composition chemistries cannot be divided conveniently into a first process gas composition A and a second process gas composition B. For example, if a given process gas is present in both the first process gas composition A and the second process gas composition B, the gas delivery system would require two mass flow controllers for the given process gas. And, because it is difficult to predict which process gases will be present in multiple process gas compositions, it would be necessary to have duplication of many mass flow controllers, thereby making the gas delivery system much larger and more costly. And, for much of the operational time, the redundant mass flow controllers would be idle/unused, leading to very poor utilization of costly technology. Therefore, an advanced gas supply system relative to the examples depicted in FIGS. 1 and 2 is needed to provide for process gas composition delivery to process modules used for rapid process gas composition switching combined with general purpose operational behavior.

The advanced gas supply system should be capable of providing multiple different process gas compositions to a given process module without requiring inefficient duplication of mass flow controllers. And, the advanced gas supply system should be capable of tightly controlling the flow rate and timing of delivery of multiple different process gas compositions to the process module in light of the fixed calibration nature of mass flow controllers, i.e., where each mass flow controller is limited to direct calibration for accurate flow control of a specific composition of process gas/gas mixture and is not directly calibrated for accurate flow control of other compositions of process gases/gas mixtures.

Example embodiments of an advanced gas supply system are disclosed herein in which multiple process gas compositions are stored in pre-mixed form in multiple (at least two) separate reservoirs located near the process module. Each of the separate reservoirs is plumbed to deliver the process gas composition that it contains at a given time to the process module by way of a corresponding mass flow controller and one or more delivery control valves. A gas delivery system is configured and used to fill the separate reservoirs with a prescribed process gas composition as needed so that a sufficient amount of the prescribed process gas composition is available within an appropriate reservoir for delivery to the process module at a required time during the plasma processing. The gas delivery system is configured to use a common supply line to fill the multiple separate reservoirs as needed to ensure that an adequate supply of each prescribed process gas composition is available within a given reservoir when needed for delivery to the process module during the plasma processing operations. In other words, one gas delivery system is configured supply multiple different process gas compositions to fill/charge two or more separate reservoirs located near the process module.

Changing/switching of the process gas composition delivered to the process module is accomplished by switching between the two or more reservoirs as the source of the currently delivered process gas composition. A separate mass flow controller is disposed between the outlet of each reservoir and the process module to accurately control the flow of the process gas composition from the reservoir to the process module. Each separate mass flow controller that is disposed between the outlet of a given reservoir and the process module is operated in a manner that accounts for any calibration offset due to any difference in process gas composition flowing through the mass flow controller at a given time as compared to the process gas composition used to originally calibrate the mass flow controller. And, the accounting for the calibration offset of each mass flow controller is determined in real-time using a mass flow meter disposed within the common supply line of the gas delivery system. Because a given reservoir can be emptied and filled with a new process gas composition while another reservoir is simultaneously being used to supply a different process gas composition to the process module, there is effectively no limit on the number of different process gas compositions that can be supplied to the process module by way of the multiple separate reservoirs.

Figure 3:
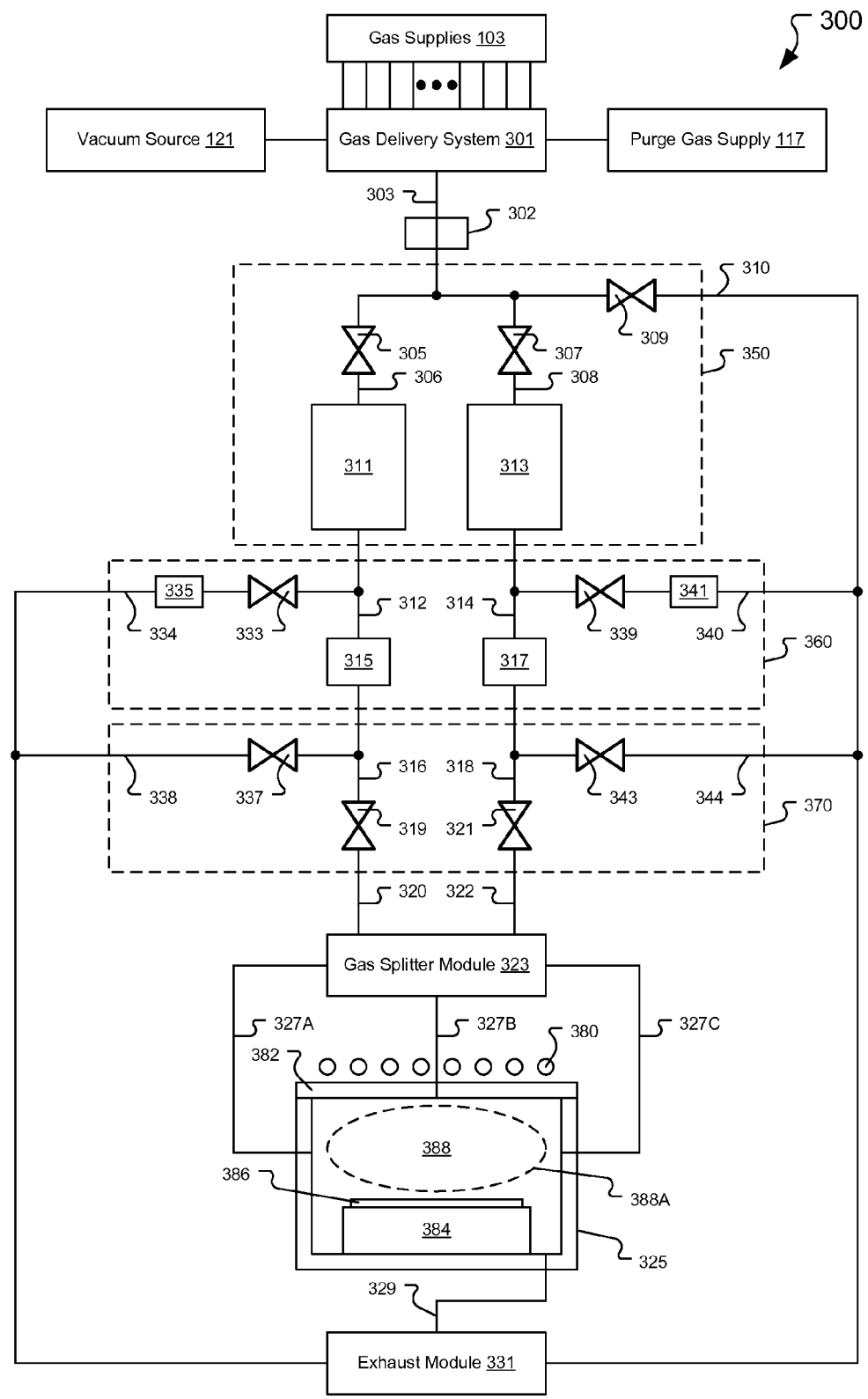
FIG. 3 shows a schematic view of an advanced gas supply system, in accordance with some embodiments of the present invention.

FIG. 3 shows a schematic view of an advanced gas supply system 300, in accordance with some embodiments of the present invention. The advanced gas supply system 300 includes a gas delivery system 301 configured to supply any one of multiple process gas compositions and/or purge gases to a common supply line 303. In some embodiments, the gas delivery system 301 can be configured like or similar to the gas delivery system 100 described with regard to FIG. 1. The gas delivery system 301 is connected to a number of gas supplies 103. The gas delivery system 301 can also be configured to draw a vacuum on the common supply line 303, or on any of the gas delivery sticks within the gas delivery system 301, by way of the vacuum source 121. The gas delivery system 301 can also be configured to direct flow of a purge gas through the common supply line 303, or on any of the gas delivery sticks within the gas delivery system 301, by way of the purge gas supply 117. Also, a mass flow meter 302 is fluidly connected to the common supply line 303 to provide a measure of gas flow rate through the common supply line 303.

The common supply line 303 is plumbed to inlets of two or more charge control valves 305, 307 and to an inlet of an exhaust control valve 309. The exhaust control valve 309 has an outlet plumbed to an exhaust module 331, as indicated by the connection line 310. The exhaust module 331 is configured to function as a low pressure source to draw in gases that are to be processed for disposal and/or recycle. Each of the charge control valves 305, 307 has its outlet plumbed to a separate reservoir 311, 313, respectively. In the example of FIG. 3, the charge control valve 305 has its outlet plumbed to the reservoir 311 through a line connection 306. And, the charge control valve 307 has its outlet plumbed to the reservoir 313 through a line connection 308. In some example embodiments, each reservoir 311, 313 has an internal volume within a range extending from about 100 cc (cubic centimeters) to about 500 cc. In some embodiments, each reservoir 311, 313 has an internal volume of about 300 cc. It should be understood, however, that each reservoir 311, 313 can be sized as needed to accommodate required operational parameters of the gas supply system 300, and fit within the spatial constraints of the fabrication facility at the location where the reservoirs 311, 313 are installed. In some embodiments, the reservoirs 311, 313 are installed near or at a process module 325 to which they will supply process gas compositions. The charge control valves 305, 307 and reservoirs 311, 313 and the exhaust control valve 309 are included as parts of a gas charge module 350 of the gas supply system 300.

Each of the reservoirs 311 and 313 has an outlet plumbed to a mass flow controller 315 and 317, respectively. Specifically, the reservoir 311 has its outlet plumbed to an inlet of the mass flow controller 315 through a connection line 312. And, the reservoir 313 has its outlet plumbed to an inlet of the mass flow controller 317 through a connection line 314. Each mass flow controller 311, 313 is configured as a pressure-insensitive mass flow controller capable of operating a pressure drops (difference between inlet and outlet pressure of the mass flow controller) below about ⅓ atm (atmosphere), and in some embodiments below about 0.1 atm. The flow rate through each of the mass flow controllers 311, 313 exhibits minimum change as the pressure in the corresponding reservoir 311, 313 changes.

Also, an exhaust control valve 333 is provided with its inlet plumbed to the connection line 312 and its outlet plumbed to the exhaust module 331, as indicated by the connection line 334. Similarly, an exhaust control valve 339 is provided with its inlet plumbed to the connection line 314 and its outlet plumbed to the exhaust module 331, as indicated by the connection line 340. The exhaust control valves 333 and 339 can be operated to provide for emptying of the reservoirs 311 and 313, respectively, directly to the exhaust module 331. And, in some embodiments, flow restrictor modules 335 and 341 can be installed along the connection lines 334 and 340, respectively, to control the flow of gases through the connection lines 334, 340 during rapid emptying of the reservoirs 311, 313. The flow restrictor modules 335 and 341 can be configured to provide for rapid pumping out of the reservoirs 311 and 313, respectively, without overwhelming the exhaust module 331. The mass flow controllers 315, 317 and the exhaust control valves 333, 339 and the flow restrictor modules 335, 341 are included as parts of a flow control module 360 of the gas supply system 300.

Each of the mass flow controllers 315 and 317 has an outlet plumbed to a delivery control valve 319 and 321, respectively. Specifically, the mass flow controller 315 has its outlet plumbed to an inlet of the delivery control valve 319 through a connection line 316. And, the mass flow controller 317 has its outlet plumbed to an inlet of the delivery control valve 321 through a connection line 318. In some embodiments, the delivery control valves 319 and 321 are pneumatic valves configured to provide for precise timing of starting and stopping flows of process gas compositions to the process module 325. However, it should be understood that other embodiments can utilize other types of delivery control valves 319 and 321, so long as the delivery control valves 319 and 321 are configured to respond to operational control signals in a manner temporally acceptable for a process to be performed within the process module 325.

An exhaust control valve 337 is provided with its inlet plumbed to the connection line 316 and its outlet plumbed to the exhaust module 331, as indicated by the connection line 338. Similarly, an exhaust control valve 343 is provided with its inlet plumbed to the connection line 318 and its outlet plumbed to the exhaust module 331, as indicated by the connection line 344. The exhaust control valves 337 and 343 can be operated to direct gas flow from the mass flow controllers 315 and 317, respectively, to the exhaust module 331. Also, in some embodiments, flow restrictor modules (like 335 and 341) can be installed in series with exhaust control valves 337 and 343, respectively, to provide for not reducing the pressure to zero within the connection lines to the process chamber 325, so as to maintain the pressure within the connection lines to the process chamber 325 near the pressure at which the process gas should be delivered to the process chamber 325. Therefore, flow restrictor modules installed in series with exhaust control valves 337 and 343 should have about the same conductance to the exhaust module 331 as the flow path through of the connection line(s) to the process module 325 and through the process module 325 to the exhaust module 331. Also, in some embodiments, any of the flow restrictor modules (including 335 and 341) can be a variable flow restrictor module in order to control the pressure of the gas being exhausted. In some embodiments, the variable flow restrictor module can include a bank of selectable orifices of various sizes and/or can be a continuously adjustable restriction such as a piezo-electric valve. The delivery control valves 319, 321 and the exhaust control valves 337, 343 are included as parts of a gas delivery switch module 370 of the gas supply system 300.

In some embodiments, each of the delivery control valves 319 and 321 has an outlet plumbed to a gas splitter module 323. As shown in the example of FIG. 3, the delivery control valve 319 has its outlet plumbed to the gas splitter module 323 through a connection line 320. And, the delivery control valve 321 has its outlet plumbed to the gas splitter module 323 through a connection line 322. The gas splitter module 323 is configured to direct the incoming flow/flows of process gas composition(s) to various different delivery ports of the process module 325, such as through connection lines 327A, 327B, 327C, by way of example. Therefore, the gas splitter module 323 can be defined to spatially divide the incoming flow/flows of process gas composition(s) to enable delivery of the process gas composition(s) to different locations within the process module 325.

Although the example embodiment of FIG. 3 shows implementation of the gas splitter module 323, it should also be understood that in other example embodiments, the outlets of one or more of the delivery control valves 319 and 321 can be plumbed directly to one or more gas delivery ports of the process module 325, without an intervening fluid connection to a gas splitter module. Also, the process module 325 has an exhaust outlet plumbed to the exhaust module 331 as indicated by connection line 329.

In some embodiments, the gas supply system 300 can be operated to deliver alternating flows of two or more different process gas compositions to a single delivery port/zone on the process module 325. For example, in these embodiments, the connection lines 320 and 322 from the delivery control valves 319 and 321, respectively, can be combined together in route to the process module 325, possibly within the gas splitter module 323. Also, in some embodiments, the gas supply system 300 can be operated to deliver different process gas compositions to different delivery ports/zones of the process module 325. For example, in these embodiments, the connection line 320 from the delivery control valve 319 can be connected to a first delivery port/zone of the process module 325, and the connection line 322 from the delivery control valve 321 can be connected to a second delivery port/zone of the process module 325. In some process modules 325, such as plasma-based etching modules, a main flow of process gas is provided to a central location of the reaction zone via an injector or showerhead, i.e., to the first delivery port/zone, while a side tuning gas is provided to delivery ports (injectors) located at the peripheral walls of the process module 325, i.e., to the second delivery port/zone. It should be appreciated that the gas supply system 300 allows for delivery of different process gas compositions to the different delivery ports/zones, by way of delivery of the different process gas compositions from the gas delivery system 301 to the multiple reservoirs 311, 313. Also, it should be appreciated that use of more reservoirs, i.e., more than two, provides for rapid switching of process gas compositions delivered to the different delivery ports/zones of the process module 325.

The process module 325 can be essentially any type of process module used in semiconductor device fabrication, where one or more process gas composition(s) are supplied to the process module 325 to affect the processing operations therein. In some example embodiments, the process module 325 is a plasma processing chamber configured to apply radiofrequency power (RF) to the process gas composition therein to generate a plasma in exposure to a substrate to be processed, whereby reactive constituents of the plasma, such as ions and/or radicals, operate to modify exposed portions of the substrate. For example, in FIG. 3, the process module 325 is shown to have a coil antennae 380 positioned above a top window 382, with a plasma processing region 388A formed below the top window 382. A substrate 386 that is to be subjected to plasma processing within the process module 325 is disposed on a substrate support 384 below the plasma processing region 388A. In various embodiments, the substrate support 384 can be an electrostatic chuck or other type of substrate support member. Also, in various embodiments, the substrate support 384 can be configured to include various cooling mechanisms, heating mechanisms, clamping mechanisms, bias electrodes, and/or sensors, where the sensors can provide for measurement of temperature, pressure, electrical voltage, and/or electrical current, among other parameters. The process module 325 includes an exterior structure formed around the plasma processing region 388A, which in conjunction with the top window 382 encloses the plasma processing region 388A and the substrate support 384. The exterior structure of the chamber 101 can be formed of an electrically conductive material and have an electrical connection to a reference ground potential 113.

During operation, the process module 325 receives one or more process gas composition(s) by way of one or more delivery ports, as exemplified by connection lines 327A, 327B, 327C in FIG. 3, and RF power is applied to the coil antennae 380, such that the RF power generates an electromagnetic field within the plasma processing region 388A to transform the one or more process gas composition(s) within the plasma processing region 388A into a plasma 388. Then, reactive constituents of the plasma 388, such as ions and/or radicals, interact with portions of the exposed surfaces of the substrate 386. In an example embodiment, the term substrate 109 as used herein refers to a semiconductor wafer. However, it should be understood that in other embodiments, the term substrate 109 as used herein can refer to substrates formed of sapphire, GaN, GaAs or SiC, or other substrate materials, and can include glass panels/substrates, metal foils, metal sheets, polymer materials, or the like. Also, in various embodiments, the substrate 109 as referred to herein may vary in form, shape, and/or size. For example, in some embodiments, the substrate 109 as referred to herein may correspond to a 200 mm (millimeters) semiconductor wafer, a 300 mm semiconductor wafer, or a 450 mm semiconductor wafer. Also, in some embodiments, the substrate 109 as referred to herein may correspond to a non-circular substrate, such as a rectangular substrate for a flat panel display, or the like, among other shapes.

The process module 325 depicted in FIG. 3 is an example of an inductively coupled plasma (ICP) processing module. In other embodiments, the process module 325 can be a different type of plasma processing module. For example, in some embodiments, the process module 325 can be a transformer coupled plasma (TCP) processing module similar to the ICP processing module. And, in some embodiments, the process module 325 can be a capacitively coupled plasma (CCP) processing module in which, instead of the coil antennae 380 used in the ICP processing module, the CCP processing module includes one or more electrodes disposed within the chamber with RF power delivered to the one or more electrodes. In the CCP processing module, the one or more electrodes can include one or more of a top electrode (e.g., a showerhead electrode or solid electrode, among others), a bottom electrode (e.g., an electrostatic chuck or substrate support, among others), and a side electrode (e.g., a peripheral ring-shaped electrode, among others), where the top, bottom, and side electrodes are configured around the plasma processing region 388A. The RF power delivered to the one or electrodes of the CCP processing module is transmitted from the one or more electrodes through the one or more process gas composition(s) present within the plasma processing region 388A to a ground reference potential, and in doing so transforms the one or more process gas composition(s) within the plasma processing region 388A into the plasma 388.

It should be understood that the ICP, TCP, and CCP process module 325 examples mentioned above are discussed in a simplified manner for ease of description. In reality, the process module 325, whether ICP, TCP, CCP, or some other type, is a complex system that includes many components not described herein. However, what should be appreciated for the present discussion is that process module 325, regardless of type, is connected to receive controlled flows of one or more process gas composition(s) under carefully controlled conditions to enable processing of the substrate 386 to obtain a specific result. Examples of plasma processing operations that may performed by the process module 325 include etching operations, deposition operations, and ashing operations, among others.

Figure 4:
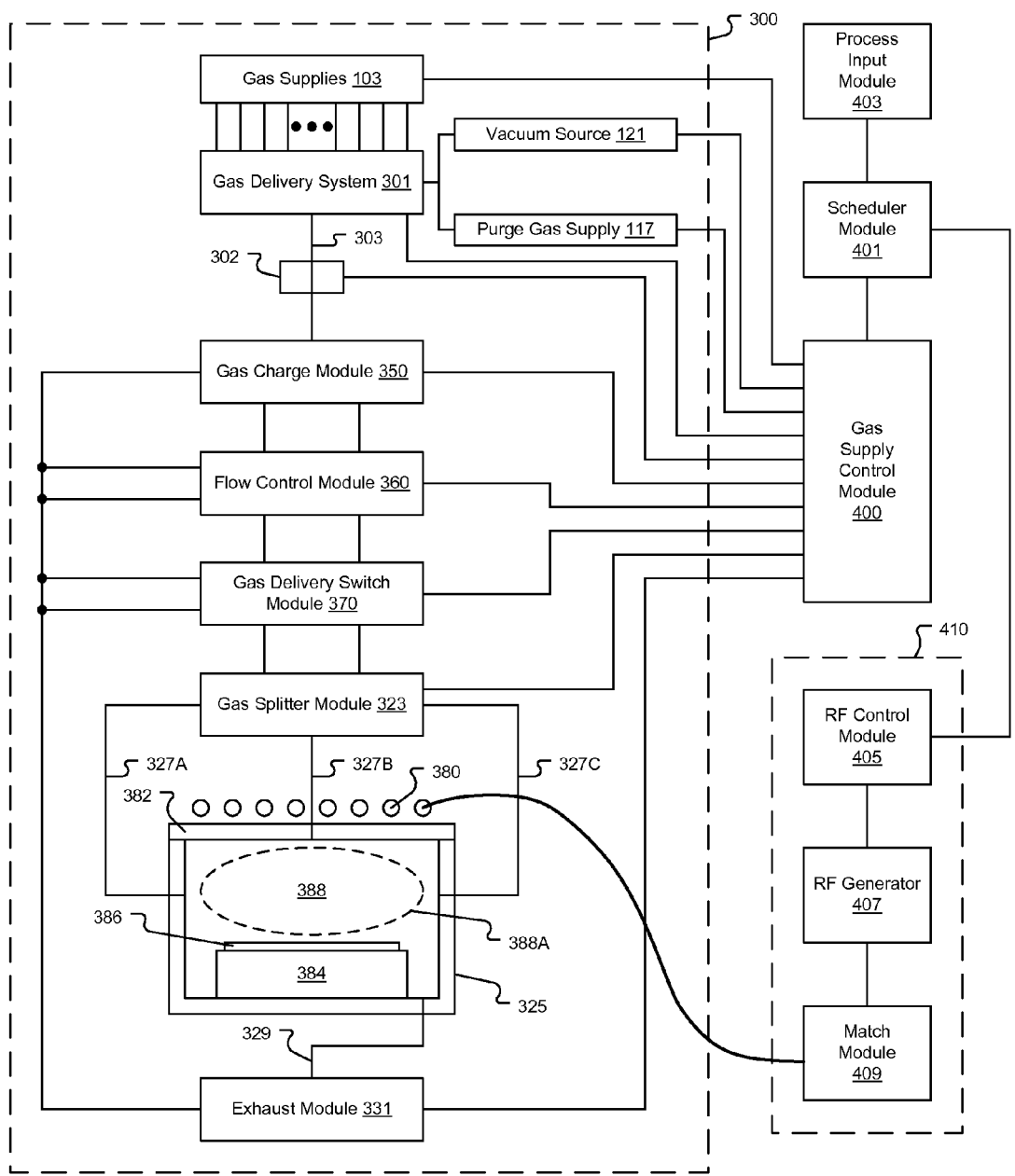
FIG. 4 shows the gas supply system interfaced with a gas supply control module, in accordance with some embodiments of the present invention.

FIG. 4 shows the gas supply system 300 interfaced with a gas supply control module 400, in accordance with some embodiments of the present invention. The gas supply control module 400 can be configured to receive status inputs from each component within the gas supply system 300, where the status inputs indicate a current operating condition of each component, and measurements of temperature, pressure, and flow rate present at each component, among others. Also, the gas supply control module 400 is configured to generate and transmit control signals to each component within the gas supply system 300, such that the overall operation of the gas supply system 300 can be synchronized by the gas supply control module 400.

For example, the gas supply control module 400 is configured and connected to control operation of each gas supply unit within the gas supplies 103 to bring a given gas supply unit online and/or take a given gas supply unit offline, and to monitor fill levels of each installed gas supply unit. The gas supply control module 400 is also configured and connected to control operation of each gas delivery stick within the gas delivery system 301. More specifically, the gas supply control module 400 is configured and connected to control operation of each LOTO valve, primary valve, mass flow controller, and secondary valve within each gas delivery stick with in the gas delivery system 301. The gas supply control module 400 is also configured and connected to receive status inputs from each LOTO valve, primary valve, mass flow controller, and secondary valve within each gas delivery stick with in the gas delivery system 301, including flow rate measurement data as measured by each mass flow controller.

Additionally, the gas supply control module 400 is configured and connected to control operation of the purge valve and the evacuation valve within the gas delivery system 301, and receive status inputs from the purge valve and evacuation valve. The gas supply control module 400 is also configured and connected to control operation of the purge gas supply 117 and the vacuum source 121, and receive status inputs from the purge gas supply 117 and the vacuum source 121. The gas supply control module 400 is also configured and connected to receive flow rate measurement data from the mass flow meter 302, indicating a flow rate within the common supply line 303 as measured by the mass flow meter 302.

The gas supply control module 400 is also configured and connected to control operation of and monitor a status of the charge control valves 305, 307 and exhaust valve 309 within the gas charge module 350. And, the gas supply control module 400 is configured and connected to control operation of and monitor a status of the reservoirs 311 and 313 within the gas charge module 350, including but not limited to monitoring a temperature and pressure and fill level within each reservoir 311 and 313. The gas supply control module 400 is also configured and connected to control operation of and monitor a status of the mass flow controllers 315, 317 and exhaust valves 333, 339 and flow restrictor modules 335, 341, if present, within the flow control module 360. The gas supply control module 400 is also configured and connected to control operation of and monitor a status of the delivery control valves 319, 321 and exhaust valves 337, 343 within the gas delivery switch module 370.

The gas supply control module 400 is also configured and connected to control operation of and monitor a status of the gas splitter module 323. For example, in some embodiments, the gas splitter module 323 may be configured to dynamically control how much process gas is directed through different flow paths to the process module 325, and this dynamic control by the gas splitter module 323 can be directed by the gas supply control module 400. Also, the gas supply control module 400 can be connected to receive various sensor measurements indicating how much process gas is flowing through a given flow path within the gas splitter module 323 or out of the gas splitter module 323. And, the gas supply control module 400 can be configured and connected to control operation of and monitor a status of the exhaust module 331, including but not limited to monitoring gas flows through the exhaust module and adjusting a pressure used to draw gases to the exhaust module.

The gas supply control module 400 is also configured and connected to receive input from a scheduler module 401 with regard to operational control of the gas supply system 300 and/or RF power supply system 410. For example, the scheduler module 401 can provide input to the gas supply control module 400 specifying a timing schedule and/or timing specifications for operation of each component within the gas supply system 300 to perform a particular process on a substrate within the process module 325. And, in some embodiments, the scheduler module 401 can be configured to have computational capability for developing and implementing a timing schedule and/or timing specifications for operation of each component within the gas supply system 300 to perform a particular process on a substrate within the process module 325 based on requirements received at the scheduler module 401 from a process input module 403.

For example, in some embodiments, the requirements received at the scheduler module 401 from the process input module 403 can include a recipe for perform a particular process on a substrate within the process module 325. In this example, the scheduler module 401 would take the prescribed recipe as an input and develop a particular control sequence for the various components within the gas supply system 300 in order to process the substrate in accordance with the prescribed recipe. In various embodiments, the recipe includes specification of processing steps at which the process module 325 is set to certain states. For example, part of the recipe specification for each processing step an include specification of one or more process gas composition(s) to be used and the corresponding flow rate(s).

The gas supply control module 400 runs a scheduler process. The scheduler module 401 provides the scheduler process to the gas supply control module 400 to direct the gas supply system 300, including the mass flow controllers 315 and 317, to provide a flow of a particular process gas composition to the process module 325 at a particular flow rate as specified in the recipe settings as provided by the process input module 403. In turn, the gas supply control system 400 directs operation of the gas supply system 300 to ensure that a correct process gas composition is present within an appropriate one of the reservoirs 311, 313 at an appropriate time and at a sufficient pressure to enable the corresponding mass flow controller 315, 317 to operate in an accurate manner. In some embodiments, the scheduler module 401 operates as a state machine, while other processes (possibly other state machines) operate to monitor conditions/states of the reservoirs 311, 313, mass flow controllers 315, 317, and other components within the gas supply system 300. These monitoring processes are also defined to send messages to the scheduler module 401 to relate conditions within the gas supply system 300. For example, the messages can indicate that the reservoirs 311, 313 are at full capacity or at vacuum.

The messages can also indicate a determined priority of each reservoir 311, 313 based on their state. The priority of each reservoir 311, 313 can be used by the scheduler module 401 to determine what process gas composition should be delivered and to which reservoir 311, 313 it should be delivered. For example, a monitoring process that detects that pressure within a given reservoir 311, 313 is dropping can send a message to the scheduler module 401 indicating increasing priority for the given reservoir 311, 313 as its pressure gets closer to a low pressure threshold at which the given reservoir 311, 313 should be refilled. Conversely, a monitoring process that detects that pressure within a given reservoir 311, 313 is rising as it is being refilled can send a message to the scheduler module 401 indicating decreasing priority for the given reservoir 311, 313 as its pressure gets closer to a full pressure threshold at which the given reservoir 311, 313 is considered full. When the priority of one reservoir 311, 313, such as a dispensing/emptying reservoir, exceeds the priority of another reservoir 311, 313, such as a charging/filling reservoir, the scheduler module 401 can direct the gas supply control module 400 to execute a sequence of operations that will deliver an appropriate process gas composition to the reservoir 311, 313 that has the highest priority.

In some embodiments, the scheduler module 401 can also receive messages that trigger delivery of certain outlet flows from one or more of the mass flow controllers 315, 317, as well as messages that trigger initialization of the gas supply system 300, and messages that trigger pre-charging/pre-filling of a reservoir 311, 313 with a particular process gas composition at a particular time so that the particular process gas composition can be ready for later delivery to the process module 325 at a specified time. In some embodiments, the scheduler module 401 is defined to have look-ahead capabilities so that the gas supply system 300 can be operated to prepare for upcoming process steps. The look-ahead capabilities of the scheduler module 401 allows for determination of which process gas compositions should be put in which reservoirs 311, 313 at which times. For example, consider a process that requires rapid alternation of process gas compositions A and B, such as ABABABAB. In this example, while the process gas composition A is being delivered from reservoir 311, the scheduler module 401 is directing the gas supply control module 400 to operate the gas supply system 300 to prepare for the upcoming transition to process gas composition B by charging reservoir 313 with process gas composition B. Then, upon transition to delivery of process gas composition B from reservoir 313, the scheduler module 401 recognizes that the next process stop requires process gas composition A and in turn directs the gas supply control module 400 to operate the gas supply system 300 to refill the reservoir 311 with process gas composition A, if needed, and so on.

As indicated above, the gas supply system 300 and associated gas supply control module 400 and scheduler module 401 provides for rapid alternation between different process gas compositions. Also, the number of different process gas compositions that can be delivered through the gas supply system 300 is essentially unlimited. For example, in the case of delivering three process gas compositions A, B, and C, such as ABCABC, the scheduler module 401 will direct the gas supply control module 400 to operate the gas supply system 300 to deliver process gas composition A from reservoir 311, deliver process gas composition B from reservoir 313 and at the same time evacuate the reservoir 311 and refill the reservoir 311 with process gas composition C, then deliver process gas composition C from reservoir 311 and at the same time evacuate the reservoir 313 and refill the reservoir 313 with process gas composition A, then deliver process gas composition A from reservoir 313 and at the same time evacuate the reservoir 311 and refill the reservoir 311 with process gas composition B, and so on.

The scheduler module 401 can be defined to look ahead as many process steps as there are reservoirs to optimize use of time for charging and preparing the reservoirs for the upcoming process steps. It should be understood that the scheduler module 401 operations described above are provided by way of example, and do not represent all possible methods by which the scheduler module 401 can operate. It should be appreciated that the scheduler module 401 can be defined to operate in accordance with many different algorithms. For example, in some embodiments, the scheduler module 401 can be programmed with the expected process gas composition flows, by way of the process input module 403, and can operate to determine which process gas composition deliveries should be sent to which reservoirs and at what times. And in turn, the scheduler module 401 can direct the gas supply control module 400 to operate on a corresponding pre-determined schedule.

Additionally, the scheduler module 401 can be connected to an RF control module 405 within the RF power supply system 410. The RF control module 405 is configured and connected to control operation of an RF power generation module 407. The RF power generation module 407 is configured to generate RF power, in the form of RF signals, for transmission to the processing module 325. RF signals generated by the RF power generation module 407 are transmitted through a matching module 409. The matching module 409 is configured to match impedances so that the RF signals generated by the RF power generation module 407 can be transmitted effectively to the plasma 388 load within the processing module 325. Generally speaking, the matching module 409 is a network of capacitors and inductors that can be adjusted to tune impedance encountered by the RF signals in their transmission to the processing module 325.

In various embodiments, the RF power generation module 407 can include one or more RF power sources operating at one or more frequencies. Multiple RF frequencies can be supplied to the same processing module 325 at the same time. In some embodiments, frequencies of the RF power signals are set within a range extending from 1 kHz (kiloHertz) to 100 MHz (megaHertz). In some embodiments, frequencies of the RF power signals are set within a range extending from 400 kHz to 60 MHz. In some embodiments, the RF power signals are generated with a frequency of about 13.56 MHz. In some embodiments, the RF power generation module 407 is set to generate RF signals at frequencies of 2 MHz, 27 MHz, and 60 MHz. In some embodiments, the RF power generation module 407 is set to generate one or more high frequency RF signals within a frequency range extending from about 1 MHz to about 60 MHz, and generate one or more low frequency RF signals within a frequency range extending from about 100 kHz to about 1 MHz. It should be understood that the above-mentioned RF frequency ranges are provided by way of example. In practice, the RF power generation module 407 can be configured to generate essentially any RF signal having essentially any frequency as needed to appropriately operate the processing module 325. Additionally, the RF power supply system 410 can include frequency-based filtering, i.e., high-pass filtering and/or low-pass filtering, to ensure that specified RF signal frequencies are transmitted to the process module 325.

Supply of RF power from the RF power supply system 410 to the process module 325 can be coordinated with supply of particular process gas composition to the process module 325. For example, in some processing operations, the RF power supply to the process module 325 can be pulsed in a coordinated manner with pulsing of the delivery of particular process gas composition to the process module 325. And, in some processing operations, the type of process gas compositions delivered to the process module 325 can be changed at a given time in conjunction with an associated change in a characteristic of the RF power delivered to the process module 325. It should be understood that the scheduler module 401 can be configured to direct the operations of the gas supply control module 400 and RF power supply system 410 to achieve a desired coordination between the delivery of the process gas composition(s) and the RF power to the processing module 325. Also, the scheduler module 401 can be defined to monitor real-time processing conditions as reported by the gas supply control module 400 and/or RF control module 405, and in turn generate as-needed adjustments to the control sequence for the various components within the gas supply system 300 and/or RF power supply system 410, thereby enabling automated operation of the gas supply system 300 and RF power supply system 410 on a time scale that is much faster than manually possible.

With reference back to FIG. 3, the gas supply system 300 is operated to supply process gas compositions through the common supply line 303 to the reservoirs 311 and 313 in a time-divided manner, so that at least one of the reservoirs 311, 313 contains enough of a required process gas composition at the time when the required process gas composition needs to be delivered to the process module 325. To provide for filling of the reservoirs 311 and 313, the process gas compositions are delivered from the gas delivery system 301 through the common supply line 303 at a high flow rate relative to a flow rate at which the process gas compositions are delivered from the reservoirs 311, 313 to the process module 325. In some embodiments, the gas delivery system 301 is configured like or similar to the gas delivery system 100 of FIG. 1, but with the mass flow controllers 109A-109L defined as high flow rate mass flow controllers. And, in some embodiments, the high flow rate mass flow controllers within the gas delivery system 301 are configured to provide for controlled flow of process gas compositions into the common supply line 303 at flow rates of 1000 sccm (standard cubic centimeters) and greater. Also, the mass flow controllers within the gas delivery system 301 are configured to operated under high outlet pressure conditions.

To fill one of the reservoirs 311, 313 (or add to the existing level of process gas composition therein), a flow of the desired process gas composition is established within the common supply line 303 by initiating the flow of the desired process gas composition from the gas delivery system 301 through the common supply line 303, while discharging the common supply line 303 to the exhaust module 331 by way of opening the exhaust valve 309, so as to establish a relatively pure flow of the desired process gas composition within the common supply line 303. Then, the exhaust valve 309 is closed, and the charge control valve 305, 307 for the reservoir 311, 313 to be filled is opened so that the process gas composition will flow from the common supply line 303 into the reservoir 311, 313 to fill the reservoir 311, 313 to a desired level. In some embodiments, before flowing the desired process gas composition through the common supply line 303, a purge gas is flowed from the gas delivery system 301 through the common supply line 303 to the exhaust module 331 in order to clean out the common supply line 303. In some embodiments, the filling of the reservoirs 311, 313 can be monitored and controlled, by way of the gas supply control module 400, based on measured pressure inside the reservoirs 311, 313. The reservoir 311, 313 that is not currently being used to supply a process gas composition to the process module 325 can be filled and prepared for use in a next process step, so that when it is time to switch to the next process step, the required process gas composition can be immediately delivered from the reservoir 311, 313 that has been filled and prepared.

In some embodiments, filling of the reservoirs 311, 313 is based on a schedule established for a given processing operation to be performed in the process module 325. Also, in some embodiments, filling of the reservoirs 311, 313 can be based on measured pressures within the reservoirs 311, 313 so that when the pressure within a given reservoir 311, 313 reaches a set point pressure, the gas delivery system 301 will operate to fill the given reservoir 311, 313 as needed. Operation of the gas delivery system 301 to fill the reservoirs 311, 313 as needed based on monitored conditions, e.g., pressure, within the reservoirs 311, 313 can be effectively implemented in an automated manner through operation of the gas supply control module 400 to monitor the conditions within the reservoirs 311, 313 and direct operation of the gas delivery system 301 and the gas charge module 350 as needed.

The mass flow controllers 315 and 317 provide for delivery of a process gas composition from its reservoir 311 and 313, respectively, at the same time the reservoir 311, 313 is being filled, so long as a pressure inside the reservoir 311, 313 stays above a minimum pressure required for the mass flow controller to correctly operate. Also, each mass flow controller 315 and 317 is configured to operate in the presence of varying pressure at its input, while continuing to deliver a specific steady flow of process gas composition to the process module 325. Also, in some processing steps, multiple reservoirs 311 and 313 and their corresponding mass flow controllers 315 and 317 can be simultaneously used/operated to deliver process gas compositions to the process module 325.

The mass flow controllers 315 and 317 are positioned close enough to the process module 325 such that the time for delivery of the process gas compositions from the mass flow controllers 315, 317 to the process module 325 is minimal. In some embodiments, the mass flow controllers 315 and 317 are positioned relative to the process module 325 such that the time for delivery of the process gas composition from the mass flow controller 315, 317 to the process module 325 is less than 1 second. In some embodiments, the mass flow controllers 315 and 317 are positioned relative to the process module such that the time for delivery of the process gas composition from the mass flow controller 315, 317 to the process module 325 is less than 0.5 second. In some embodiments, the distance between the mass flow controllers 315 and 317 and the process module 325 is less than about 2 feet. In some embodiments, the plumbed distance between the process module 325 and each outlet of the mass flow controllers 315 and 317 is substantially equal. In some embodiments, the scheduling of operation of the mass flow controllers 315 and 317, e.g., time on, duration on, time off, etc., can be defined to account for differences in the plumbed distance between the process module 325 and each output of the mass flow controllers 315 and 317.

Mass flow controllers 315 and 317 are calibrated based on a composition of a particular process gas or gas mixture. The flow rate measurement performed by the mass flow controllers 315 and 317 will be accurate for the particular process gas composition upon which its calibration is based. However, for process gas compositions different than the particular process gas composition upon which its calibration is based, the flow rate measurements and corresponding flow rate control provided by the mass flow controllers 315 and 317 will be out of calibration and inaccurate. Therefore, because the gas supply system 300 is configured to provide for delivery of essentially any composition of process gas/gas mixture to the process module 325 by way of the mass flow controllers 315 and 317, it is necessary to determine and apply an appropriate calibration adjustment factor to the flow rates reported by the mass flow controllers 315 and 317 in order to have the correct flow rates of process gas compositions delivered from the mass flow controllers 315 and 317 to the process module 325. Methods are disclosed herein for in-situ calibration of the mass flow controllers 315 and 317 for each process gas composition delivered through the common supply line 303.

In some embodiments, the mass flow meter 302 on the common supply line 303 is used to determine a calibration adjustment factor that can be applied to the mass flow controllers 315 and 317 for each different process gas composition that is delivered through the common supply line 303 to the reservoirs 311, 313, and ultimately through the mass flow controllers 315, 317. The mass flow controllers 315, 317 can incorporate the same flow rate measurement technology as the mass flow meter 302. But, the mass flow controllers 315, 317 will include a flow control valve and additional control circuitry that is not present in the mass flow meter 302. When the mass flow meter 302 and the mass flow controllers 315, 317 are from the same family, i.e., same manufacturer and same flow rate technology (thermal-based, pressure-based, etc.), then a calibration adjustment factor determined for the mass flow meter 302 for a given process gas composition will be equally applicable to the mass flow controllers 315, 317 for the given process gas composition. Based on this consideration, the mass flow meter 302 on the common supply line 303 is intentionally selected from the same family as the mass flow controllers 315, 317, so that a calibration adjustment factor can be determined for the mass flow meter 302 for each different type of process gas composition that flows through the common supply line 303 and in turn be used for calibration adjustment of the mass flow controllers 315 and 317.

When a given process gas composition is being supplied from the gas delivery system 301 to the common supply line 303, the flow controllers within the gas delivery system 301 can be used to obtain a true measure of the process gas composition flow rate into the common supply line 303. More specifically, with reference to the gas delivery system 100 of FIG. 1 by way of example, each mass flow controller 109A-109L that is being operated to delivery gas to the common manifold 113 and ultimately to the common supply line 303 (in the gas supply system 300 of FIG. 3) will be calibrated to provide an accurate measurement of the flow rate of the particular gas composition that it is delivering. Therefore, an accurate measurement of the flow rate (Q1) of a given process gas composition through the common supply line 303 at a given time can be determined by adding up the flow rates reported by the mass flow controllers 109A-109L within the gas delivery system 301 that are actively delivering gas to the common supply line 303 at the given time. And, this accurate measurement of the flow rate (Q1) of the given process gas composition into the common supply line 303 at the given time can be used to determine a calibration adjustment factor (k) for the mass flow meter 302 for the given process gas composition.

For example, the flow rate (Q2) being reported by the mass flow meter 302 for the given process gas composition within the common supply line 303 can be compared to the accurate measurement of the flow rate (Q1) of the given process gas composition into the common supply line 303 based on the mass flow controllers 109A-109L within the gas delivery system 301 to determine the calibration adjustment factor (k) for the given process gas composition, such as a multiplicative constant calibration adjustment factor (1/k, where k=Q2/Q1) that when multiplied by the flow rate (Q2) being reported by the mass flow meter 302 will yield the correct flow rate (Q1) of the given process gas composition within the common supply line 303.

Then, because the mass flow controllers 315, 317 use the same flow rate measurement technology as the mass flow meter 302, the calibration adjustment factor (1/k) determined for the mass flow meter 302 for the given process gas composition can be applied to the mass flow controllers 315, 317 when the given process gas composition is being flowed through the mass flow controllers 315, 317. In this manner, the actual flow rate of the given process gas composition through the mass flow controllers 315, 317 at a given time will be determined by multiplying the flow rate measured/reported by the mass flow controllers 315, 317 at the given time by the calibration adjustment factor (1/k) for the given process gas composition as determined for the mass flow meter 302. As a result, the mass flow controllers 315, 317 can be operated to accurately control the flow of the given process gas composition even though they are not directly calibrated for the given process gas composition. It should be appreciated that the calibration adjustment factor (1/k) for a given process gas composition can be determined before the mass flow controller 315, 317 is operated to deliver the given process gas composition, such that accurate flow of the given process gas composition can be immediately obtained from the mass flow controller 315, 317.

In addition to (or as an alternative to) using the mass flow meter 302 to determine a calibration adjustment factor for the mass flow controllers 315, 317, the flow rate of a given process gas composition may be determined based on analysis of a rate of pressure drop within the reservoir 311, 313 as the given process gas/gas mixture is being delivered form the reservoir 311, 313, when the input of the reservoir 311, 313 is isolated/closed. This rate of pressure drop technique for determining the flow rate of the process gas composition from the reservoir 311, 313 requires accurate measurement of the internal volume of the reservoir 311, 313 and the temperature in the reservoir 311, 313. The mass flow controller 315, 317 of the reservoir 311, 313 is set to a nominal value, and a manometer is used to determine the rate of pressure loss in the reservoir 311, 313. Given that the outlet flow rate from the reservoir 311, 313 is Q (atm-liter)/second, then the rate of loss of pressure is equal to Q/V (atmospheres/second) where V is the reservoir 311, 313 volume in liters. The measured flow rate Q out of the reservoir 311, 313 can be used to derive a calibration factor for the corresponding mass flow controller 315, 317, such that a desired flow rate can be programmed.

Also, this rate of pressure drop technique is retrospective in that the flow rate of the process gas composition from the reservoir 311, 313 to the process module 325 must be already underway in order to obtain data on the pressure drop within the reservoir 311, 313 and in turn on the flow rate from the reservoir 311, 313. However, in some embodiments, it is possible to perform learning processes for various process gas compositions and conditions, e.g., temperature, to have an acceptable measure of the flow rate upon initiating delivery of the process gas composition from the reservoir 311, 313 to the process module 325. In other words, calibration factors based on the rate of pressure drop technique can be determined by learning processes prior to running a real process. Alternatively, a closed-loop algorithm can be used to control output flow through the mass flow controller 315, 317 based on the pressure loss rate in the corresponding reservoir 311, 313.

Figure 5:
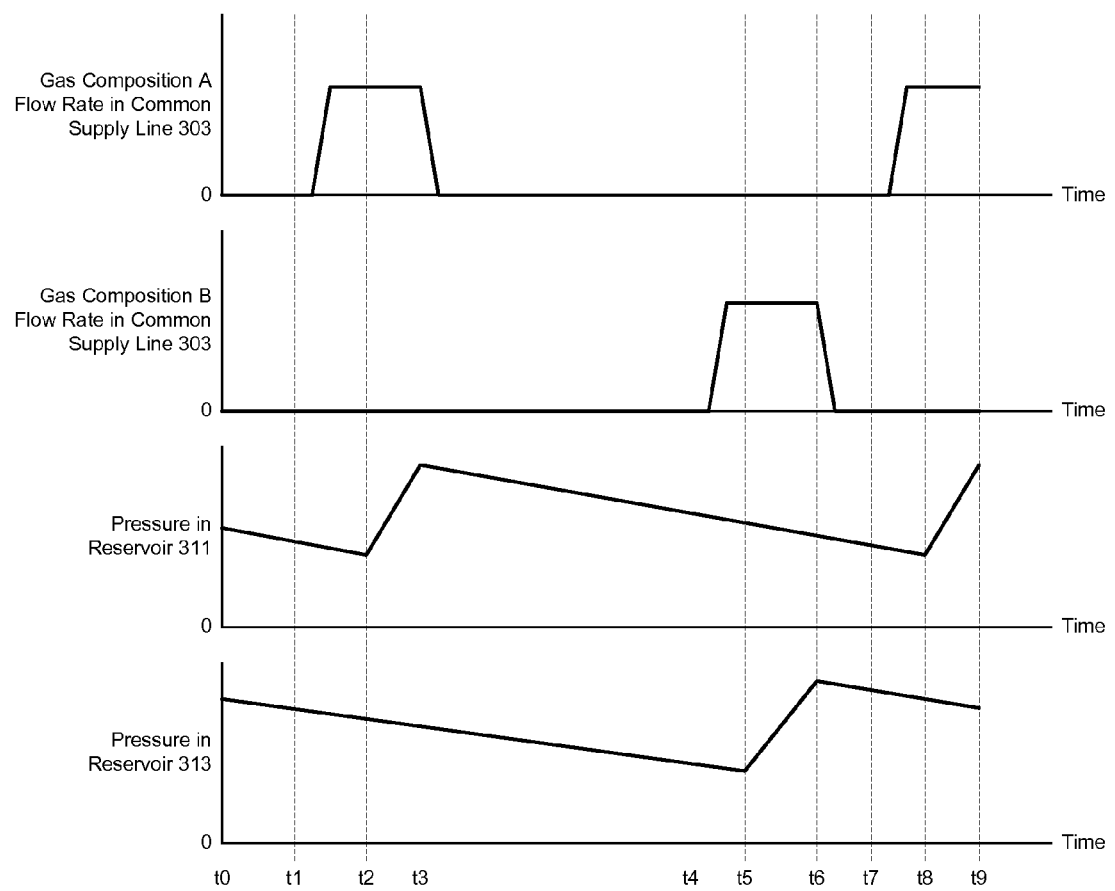
FIG. 5 shows a timing diagram that illustrates how the gas supply system can be operated to provide controlled flows of two different process gas compositions from the common supply line to the process module, in accordance with some embodiments of the present invention.

FIG. 5 shows a timing diagram that illustrates how the gas supply system 300 can be operated to provide controlled flows of two different process gas compositions from the common supply line 303 to the process module 325, in accordance with some embodiments of the present invention. It should be understood that the example timing sequence depicted in FIG. 5 is a simplified example, and is not a limiting example in that much more complex timing sequences for operation of the gas supply system 300 can be implemented in actual processing applications. At time t0, there is no flow of process gas within the common supply line 303, and charge control valves 305 and 307 are closed, and the exhaust control valve 309 is closed. Also, at time t0, the gas supply control module 400 has directed both mass flow controllers 315 and 317 to operate to deliver process gas compositions from reservoirs 311 and 313, respectively, to the process module 325. As a result, moving forward in time from time t0, each of the reservoirs 311 and 313 is experiencing a decrease in pressure as the process gas compositions A and B therein are drawn through the mass flow controllers 315 and 317, respectively.

At time t1, the gas supply control module 400 determines that the reservoir 311 requires refilling, and directs the gas delivery system 301 to begin delivering process gas composition A to the common supply line 303. For the time period from time t1 to time t2, the process gas composition in the common supply line 303 will not be certain, because of possible delays in operation of the gas delivery system 301 to delivery the process gas composition A, and because of other delays associated with establishing a uniform flow of process gas composition A along the common supply line 303. However, the time period from time t1 to time t2 will be short because flow rates from the gas delivery system 301 down the common supply line 303 will be large, e.g., 1000 sccm or greater in some embodiments. The common supply line 303 is configured to have a high conductance to accommodate the high flow rates from the gas delivery system 301. During the time period from time t1 to time t2, the gas supply control module 400 directs the process gas flowing through the common supply line 303 to be diverted to the exhaust module 331 by opening the exhaust control valve 309, while keeping the charge control valves 305 and 307 closed.

At time t2, the common supply line 303 is filled with the process gas composition A, and the gas supply control module 400 directs the exhaust control valve 309 to close and directs the charge control valve 305 to open to deliver the process gas composition A from the common supply line 303 to the reservoir 311. So, starting at time t2, the pressure in reservoir 311 begins to increase because the flow rate of the process gas composition A coming into the reservoir 311 is greater than the flow rate of the process gas composition A being delivered from the reservoir 311 to the process module 325 by way of the mass flow controller 315.

At time t3, the reservoir 311 has filled to an acceptable pressure level, and the gas supply control module 400 operates to close the charge control valve 305 such that process gas composition A is no longer delivered to the reservoir 311 from the common supply line 303. The gas supply control module 400 then operates to instruct the gas delivery system 301 to stop delivery of the process gas composition A to the common supply line 303, and operates to open the exhaust control valve 309 and evacuate the common supply line 303. Also, as an option in some embodiments, the gas supply control module 400 can direct the gas delivery system 301 to begin delivering a purge gas to the common supply line 303 in order to flush the process gas composition A from the common supply line 303. In some embodiments, the purge gas has a composition that when present in small concentrations will not adversely affect the processing within the process module 325.

At time t4, the gas supply control module 400 determines that reservoir 313 should be refilled. Therefore, at time t4, the gas delivery system 301 is directed by the gas supply control module 400 to begin delivering process gas composition B to the common supply line 303. For the time period from time t4 to time t5, the process gas composition in the common supply line 303 will not be certain. Therefore, from the time t4 to the time t5, the gas supply control module 400 directs the exhaust control valve 309 to be open, while both charge control valves 305 and 307 are closed, to divert the gas flow within the common supply line 303 to the exhaust module 331 to allow for establishment of a uniform flow of process gas composition B along the common supply line 303.

At time t5, the common supply line 303 is filled with the process gas composition B, and the gas supply control module 400 directs the exhaust control valve 309 to close and the charge control valve 307 to open to deliver the process gas composition B from the common supply line 303 to the reservoir 313. So, starting at time t5, the pressure in reservoir 313 begins to increase because the flow rate of the process gas composition B coming into the reservoir 313 is greater than the flow rate of the process gas composition B being delivered from the reservoir 313 to the process module 325 by way of the mass flow controller 317.

At time t6, the reservoir 313 has filled to an acceptable pressure level, and the gas supply control module 400 operates to close the charge control valve 307 such that process gas composition B is no longer delivered to the reservoir 313 from the common supply line 303. The gas supply control module 400 then operates to instruct the gas delivery system 301 to stop delivery of the process gas composition B to the common supply line 303, and operates to open the exhaust control valve 309 and evacuate the common supply line 303. Also, as an option in some embodiments, the gas supply control module 400 can direct the gas delivery system 301 to begin delivering a purge gas to the common supply line 303 in order to flush the process gas composition B from the common supply line 303.

At time t7 the gas supply control module 400 determines that the reservoir 311 needs to again be refilled. So, at time t7 the gas supply control module 400 begins performing the same operations as previously discussed with regard to time t1. Also, from the time t7 to the time t8, the gas supply control module 400 performs the same operations as previously performed during the time period from time t2 to time t3. And, at time t9, the gas supply control module 400 performs the same operations as previously performed at time t3.

It should be appreciated that the flows of process gas compositions A and B from the mass flow controllers 315 and 317, respectively, through the delivery control valves 319 and 321, respectively, to the process module 325 are not interrupted or changed at any time during the sequence depicted in the example of FIG. 5. Therefore, the sequence of FIG. 5 demonstrates the gas supply system 300 ability to delivery two different process gas composition flows to the same process module 325 from the same gas delivery system 301. Also, with fast-acting delivery control valves 319 and 321, the gas supply system 300 can provide alternating process gas compositions to the process module 325 with a time control on the order 0.1 second or better between process gas composition transitions. Also, the exhaust control valves 337 and 343 can be operated to maintain flows of different process gas compositions through the mass flow controllers 315 and 317, respectively, by diverting the flow that is not currently needed at the process module 325 to the exhaust module 331, thereby further minimizing the transition time between supply of the different process gas compositions to the process module 325. And, the reservoirs 311 and 313 can be refilled on a much slower time scale compatible with establishing and stabilizing process gas flow from the gas delivery system 301 within the common supply line 303.

The gas supply control module 400 can be configured to execute a scheduling algorithm (which may be provided by the scheduler module 401) to determine what process gas compositions should be delivered to the common supply line 303 at a given time such that the output flows from the reservoirs 311, 313 can be sustained. Also, in some embodiments, the scheduling algorithm can be defined to optimize operation of the gas supply system 300, such as by minimizing pressure fluctuations within the reservoirs 311 and 313 and/or by minimizing an amount of process gas composition that is diverted to the exhaust module 331, among other optimization considerations for improving operation, extending longevity, and reducing overall cost of the gas supply system 300.

Figure 6:
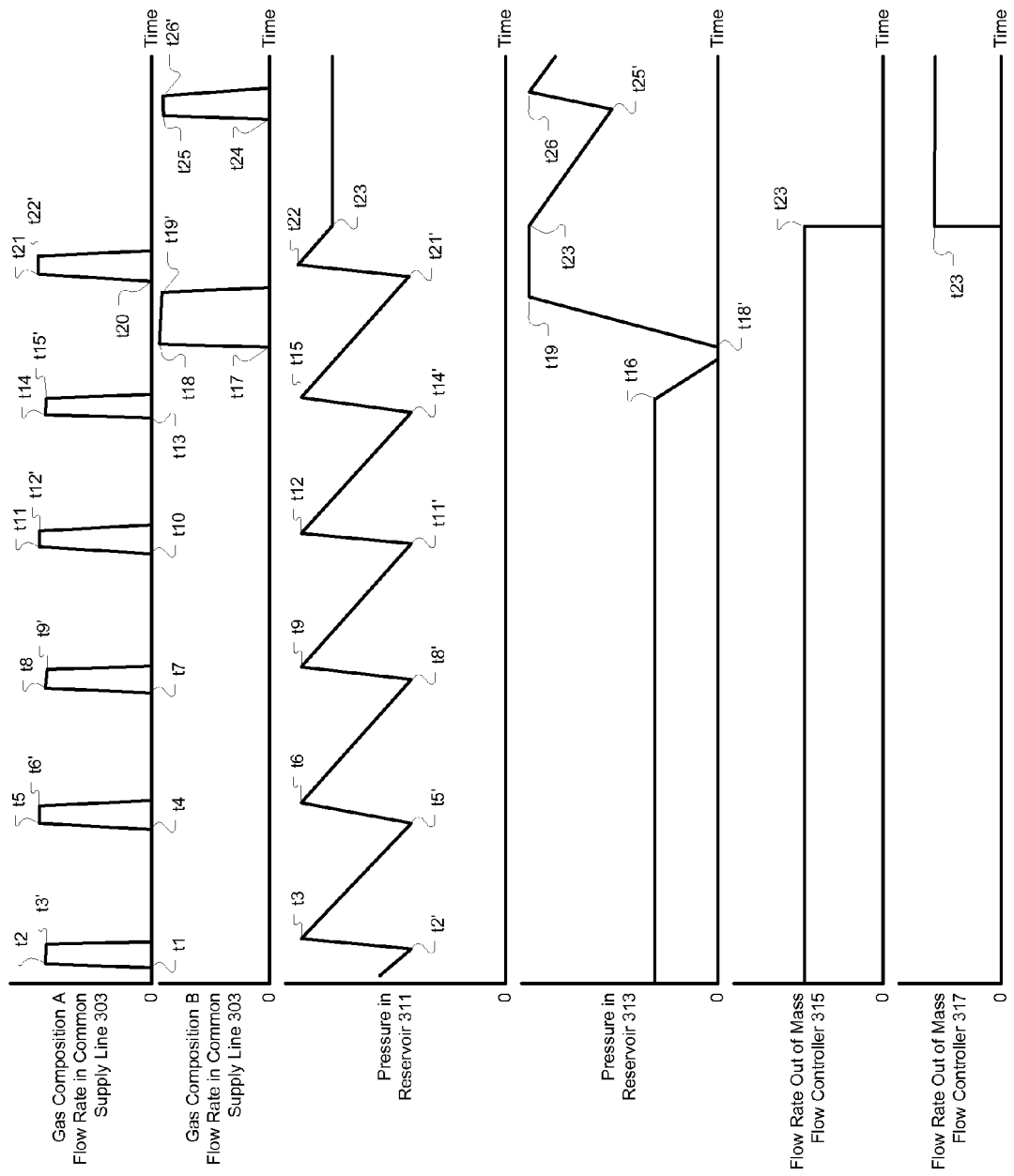
FIG. 6 shows another timing diagram that illustrates how the gas supply system can be operated to provide controlled flows of two different process gas compositions from the common supply line to the process module, in accordance with some embodiments of the present invention.

FIG. 6 shows another timing diagram that illustrates how the gas supply system 300 can be operated to provide controlled flows of two different process gas compositions from the common supply line 303 to the process module 325, in accordance with some embodiments of the present invention. At time t0, delivery control valve 319 is open and the mass flow controller 315 is operating to deliver process gas composition A from reservoir 311 to the process module 325. And, at time t0, the delivery control valve 321 is closed such that none of a process gas composition B is delivered from the reservoir 313 to the process module 325. Also, at time t0, the charge control valves 305 and 307 are closed.

From time t1 to time t2, the gas delivery system 301 (and possibly the exhaust control valve 309) is operated to establish a flow of process gas composition A within the common supply line 303. At time t2' (equal to time t2 or right after time t2), the exhaust control valve 309 is closed if open, and then the charge control valve 305 is opened to allow filling of the reservoir 311 from the common supply line 303 with process gas composition A. From time t2' to time t3, the pressure within the reservoir 311 rises as the reservoir 311 is filled with the process gas composition A. At time t3, the charge control valve 305 is closed. Then, at time t3' (equal to time t3 or right after time t3) the delivery of the process gas composition A from the gas delivery system 301 to the common supply line 303 is stopped. After the time t3, the pressure within the reservoir 311 drops as the process gas composition A continues to be delivered from the reservoir 311 to the process module 325 by way of the mass flow controller 315 and delivery control valve 319.

From time t4 to time t5, the gas delivery system 301 (and possibly the exhaust control valve 309) is operated to again establish a flow of process gas composition A within the common supply line 303. At time t5' (equal to time t5 or right after time t5), the exhaust control valve 309 is closed if open, and then the charge control valve 305 is opened to allow filling of the reservoir 311 from the common supply line 303 with process gas composition A. From time t5' to time t6, the pressure within the reservoir 311 rises as the reservoir 311 is filled with the process gas composition A. At time t6, the charge control valve 305 is closed. Then, at time t6' (equal to time t6 or right after time t6) the delivery of the process gas composition A from the gas delivery system 301 to the common supply line 303 is stopped. After the time t6, the pressure within the reservoir 311 drops as the process gas composition A continues to be delivered from the reservoir 311 to the process module 325 by way of the mass flow controller 315 and delivery control valve 319.

From time t7 to time t8, the gas delivery system 301 (and possibly the exhaust control valve 309) is operated to again establish a flow of process gas composition A within the common supply line 303. At time t8' (equal to time t8 or right after time t8), the exhaust control valve 309 is closed if open, and then the charge control valve 305 is opened to allow filling of the reservoir 311 from the common supply line 303 with process gas composition A. From time t8' to time t9, the pressure within the reservoir 311 rises as the reservoir 311 is filled with the process gas composition A. At time t9, the charge control valve 305 is closed. Then, at time t9' (equal to time t9 or right after time t9) the delivery of the process gas composition A from the gas delivery system 301 to the common supply line 303 is stopped. After the time t9, the pressure within the reservoir 311 drops as the process gas composition A continues to be delivered from the reservoir 311 to the process module 325 by way of the mass flow controller 315 and delivery control valve 319.

From time t10 to time t11, the gas delivery system 301 (and possibly the exhaust control valve 309) is operated to again establish a flow of process gas composition A within the common supply line 303. At time t11' (equal to time t11 or right after time t11), the exhaust control valve 309 is closed if open, and then the charge control valve 305 is opened to allow filling of the reservoir 311 from the common supply line 303 with process gas composition A. From time t11' to time t12, the pressure within the reservoir 311 rises as the reservoir 311 is filled with the process gas composition A. At time t12, the charge control valve 305 is closed. Then, at time t12' (equal to time t12 or right after time t12) the delivery of the process gas composition A from the gas delivery system 301 to the common supply line 303 is stopped. After the time t12, the pressure within the reservoir 311 drops as the process gas composition A continues to be delivered from the reservoir 311 to the process module 325 by way of the mass flow controller 315 and delivery control valve 319.

From time t13 to time t14, the gas delivery system 301 (and possibly the exhaust control valve 309) is operated to again establish a flow of process gas composition A within the common supply line 303. At time t14' (equal to time t14 or right after time t14), the exhaust control valve 309 is closed if open, and then the charge control valve 305 is opened to allow filling of the reservoir 311 from the common supply line 303 with process gas composition A. From time t14' to time t15, the pressure within the reservoir 311 rises as the reservoir 311 is filled with the process gas composition A. At time t15, the charge control valve 305 is closed. Then, at time t15' (equal to time t15 or right after time t15) the delivery of the process gas composition A from the gas delivery system 301 to the common supply line 303 is stopped. After the time t15, the pressure within the reservoir 311 drops as the process gas composition A continues to be delivered from the reservoir 311 to the process module 325 by way of the mass flow controller 315 and delivery control valve 319.

At time t16, the gas supply system 300 operates to prepare the reservoir 313 for use in an upcoming process step. Specifically, at time t16, the exhaust control valve 339 is opened to provide for emptying of the contents of the reservoir 313 to the exhaust module 331. From time t17 to time t18, the gas delivery system 301 (and possibly the exhaust control valve 309) is operated to establish a flow of process gas composition B within the common supply line 303. From time t16, the pressure within the reservoir 313 drops as the reservoir 313 is emptied in preparation for use. At time t18' (equal to time t18 or right after time t18), the exhaust control valve 309 is closed if open, and then the charge control valve 307 is opened to allow filling of the reservoir 313 from the common supply line 303 with process gas composition B. From time t18' to time t19, the pressure within the reservoir 313 rises as the reservoir 313 is filled with the process gas composition B. At time t19, the charge control valve 307 is closed. Then, at time t19' (equal to time t19 or right after time t19) and the delivery of the process gas composition B from the gas delivery system 301 to the common supply line 303 is stopped. After the time t19, the pressure within the reservoir 313 holds steady as the reservoir 313 is in standby mode ready for use to deliver the process gas composition B to the process module 325.

From time t20 to time t21, the gas delivery system 301 (and possibly the exhaust control valve 309) is operated to again establish a flow of process gas composition A within the common supply line 303. At time t21' (equal to time t21 or right after time t21), the exhaust control valve 309 is closed if open, and then the charge control valve 305 is opened to allow filling of the reservoir 311 from the common supply line 303 with process gas composition A. From time t21' to time t22, the pressure within the reservoir 311 rises as the reservoir 311 is filled with the process gas composition A. At time t22, the charge control valve 305 is closed. Then, at time t22' (equal to time t22 or right after time t22) the delivery of the process gas composition A from the gas delivery system 301 to the common supply line 303 is stopped. After the time t22, the pressure within the reservoir 311 drops as the process gas composition A continues to be delivered from the reservoir 311 to the process module 325 by way of the mass flow controller 315 and delivery control valve 319.

It should be understood that from time t0 to time t23, the process gas composition A is delivered at a steady flow rate and in an uninterrupted manner from the reservoir 311 through the mass flow controller 315 and delivery control valve 319 to the process module 325, even during the multiple refilling cycles of the reservoir 311, and during the preparation of the reservoir 313. Then, at time t23, the delivery control valve 319 is closed and the delivery control valve 321 is opened, so as to cause a step change from delivery of the process gas composition A to delivery of the process gas composition B to the process module 325. In some embodiments, this step change in process gas composition can be done in a fraction of a second, on the order to 0.5 second or 0.1 second or even less. From the time t23, the pressure in the reservoir 313 drops as the process gas composition B is delivered from the reservoir 313 to the process module 325 by way of the mass flow controller 317 and delivery control valve 321. Also, from the time t23, the pressure in the reservoir 311 holds steady as no process gas is delivered from the reservoir 311.

In some embodiments, prior to the time t23, the exhaust control valve 343 can be opened and the mass flow controller 317 can be operated to established a uniform and stable flow of the process gas composition B within the connection lines extending from the reservoir 313 through the mass flow controller 317 to the delivery control valve 321. And, in these embodiments, at the time t23, or just prior to the time t23, the exhaust control valve 343 can be closed. In this manner, a uniform and stable flow of the process gas composition B can be delivered from the delivery control valve 321 as soon as the delivery control valve 321 is opened at time t23.

From time t24 to time t25, the gas delivery system 301 (and possibly the exhaust control valve 309) is operated to again establish a flow of process gas composition B within the common supply line 303. At time t25' (equal to time t25 or right after time t25), the exhaust control valve 309 is closed if open, and then the charge control valve 307 is opened to allow filling of the reservoir 313 from the common supply line 303 with process gas composition B. From time t25' to time t26, the pressure within the reservoir 313 rises as the reservoir 313 is filled with the process gas composition B. At time t26, the charge control valve 307 is closed. Then, at time t26' (equal to time t26 or right after time t26) the delivery of the process gas composition B from the gas delivery system 301 to the common supply line 303 is stopped. After the time t26, the pressure within the reservoir 313 drops as the process gas composition B continues to be delivered from the reservoir 313 to the process module 325 by way of the mass flow controller 317 and delivery control valve 321. It should be understood that from time t23, the process gas composition B is delivered at a steady flow rate and in an uninterrupted manner from the reservoir 313 through the mass flow controller 317 and delivery control valve 321 to the process module 325, even during refilling of the reservoir 313.

As shown in FIG. 6, pulses of the process gas composition A are provided to the reservoir 311 while the reservoir 311 is simultaneously being used to deliver a flow of the process gas composition A to the process module 325. And, the filling of reservoir 313 with the process gas composition B is performed at a time when the reservoir 311 is not being filled, so as to allow sharing of the common supply line 303 by the two reservoirs 311 and 313. The sharp step change transition from delivery of process gas composition A to delivery of process gas composition B to the process module 325 can be highly advantageous when the desired flow rate of the process gas composition B is low. Unlike conventional gas supply systems, the gas supply system 300 utilizing the pre-filled reservoirs 311, 313 is able to perform the sharp step change transition from delivery of process gas composition A to delivery of process gas composition B to the process module 325 without incurring adverse co-flow effects. Also, it should be noted that the filling of the reservoirs 311, 313 can be performed at a much higher flow rate than the flow rate being delivered from the reservoirs 311, 313 to the process module 325.

Figure 7:
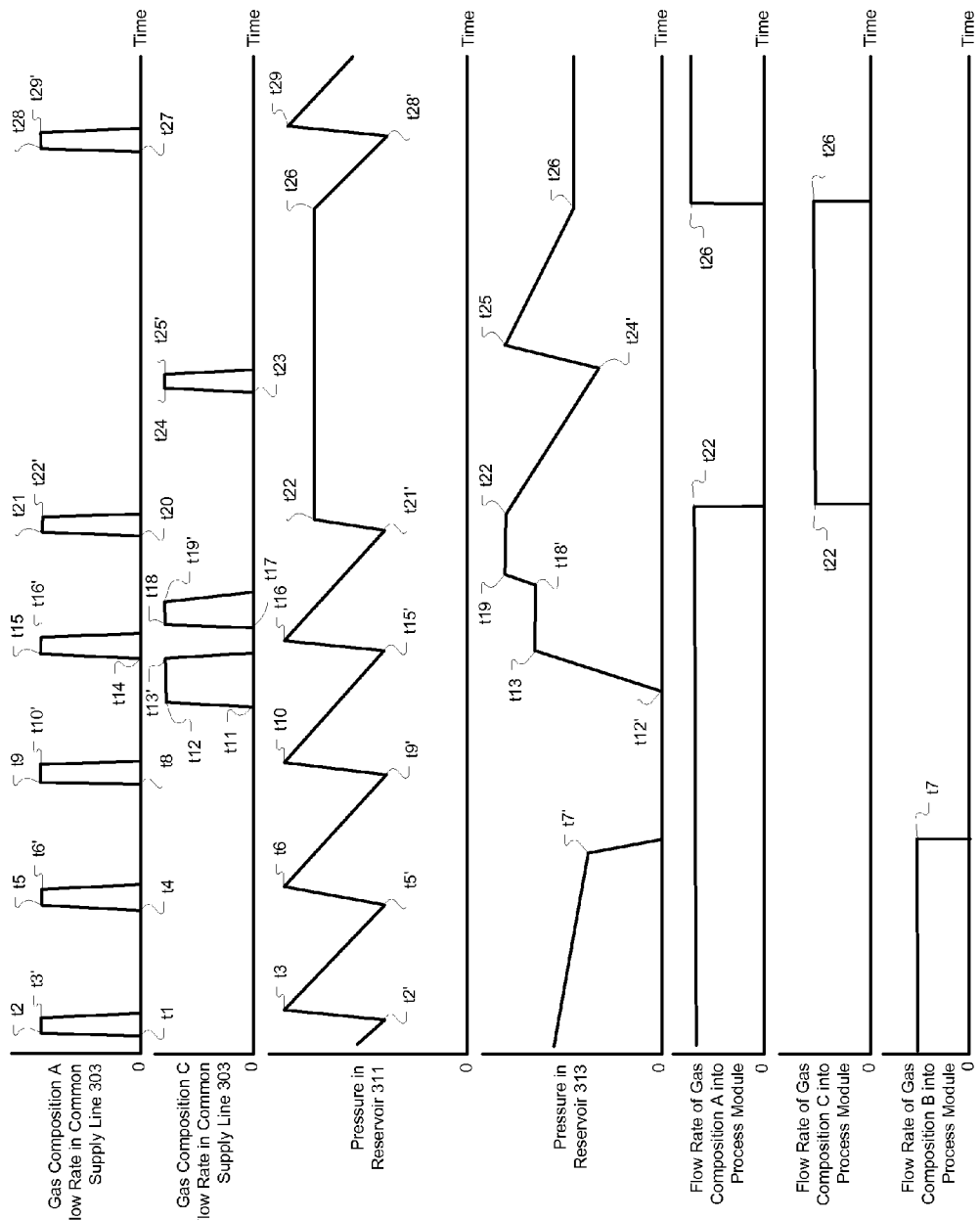
FIG. 7 shows a timing diagram that illustrates how the gas supply system can be operated to provide controlled flows of three different process gas compositions from the common supply line to the process module, in accordance with some embodiments of the present invention.

FIG. 7 shows a timing diagram that illustrates how the gas supply system 300 can be operated to provide controlled flows of three different process gas compositions from the common supply line 303 to the process module 325, in accordance with some embodiments of the present invention. The example of FIG. 7 shows how the gas supply system 300 can be operated through a number of process steps, including depiction of how the pressures within the reservoirs 311, 313 change in accordance with flows of different process gas compositions into and out of the reservoirs 311, 313.

At time t0, delivery control valve 319 is open and the mass flow controller 315 is operating to deliver process gas composition A from reservoir 311 to the process module 325. Also, at time t0, the delivery control valve 321 is open and the mass flow controller 317 is operating to deliver process gas composition B from reservoir 313 to the process module 325. And, at time t0, the charge control valves 305 and 307 are closed. Therefore, at time t0, the gas supply system 300 initially delivers both of process gas compositions A and B from reservoirs 311 and 313, respectively. Also, at time t0, the flow rate of process gas composition A from reservoir 311 is higher than the flow rate of process gas composition B from reservoir 313, as indicated by the greater rate of decrease of pressure in reservoir 311 as compared to reservoir 313.

From time t1 to time t2, the gas delivery system 301 (and possibly the exhaust control valve 309) is operated to establish a flow of process gas composition A within the common supply line 303. At time t2' (equal to time t2 or right after time t2), the exhaust control valve 309 is closed if open, and then the charge control valve 305 is opened to allow filling of the reservoir 311 from the common supply line 303 with process gas composition A. From time t2' to time t3, the pressure within the reservoir 311 rises as the reservoir 311 is filled with the process gas composition A. At time t3, the charge control valve 305 is closed. Then, at time t3' (equal to time t3 or right after time t3) the delivery of the process gas composition A from the gas delivery system 301 to the common supply line 303 is stopped. After the time t3, the pressure within the reservoir 311 drops as the process gas composition A continues to be delivered from the reservoir 311 to the process module 325 by way of the mass flow controller 315 and delivery control valve 319.

From time t4 to time t5, the gas delivery system 301 (and possibly the exhaust control valve 309) is operated to again establish a flow of process gas composition A within the common supply line 303. At time t5' (equal to time t5 or right after time t5), the exhaust control valve 309 is closed if open, and then the charge control valve 305 is opened to allow filling of the reservoir 311 from the common supply line 303 with process gas composition A. From time t5' to time t6, the pressure within the reservoir 311 rises as the reservoir 311 is filled with the process gas composition A. At time t6, the charge control valve 305 is closed. Then, at time t6' (equal to time t6 or right after time t6) the delivery of the process gas composition A from the gas delivery system 301 to the common supply line 303 is stopped. After the time t6, the pressure within the reservoir 311 drops as the process gas composition A continues to be delivered from the reservoir 311 to the process module 325 by way of the mass flow controller 315 and delivery control valve 319.

From time t0 to time t7 the pressure within the reservoir 313 drops as the process gas composition B is delivered at a steady flow rate and in an uninterrupted manner from the reservoir 313 to the process module 325 by way of the mass flow controller 317 and delivery control valve 321. From time t0 to time t7 reservoir 311 is refilled twice. Also, from time t0 to time t7, reservoir 313 is not refilled. Then, at time t7, the delivery control valve 321 is closed, so as to immediately stop delivery of the process gas composition B to the process module 325. In some embodiments, delivery of the process gas composition can be stopped in a fraction of a second, on the order to 0.5 second or 0.1 second or even less. After time t7, the gas supply control module 400 recognizes that an upcoming process step needs to use reservoir 313 to deliver process gas composition C. Therefore, at time t7', the gas supply system 300 operates to prepare the reservoir 313 for use in the upcoming process step. Specifically, at time t7', the exhaust control valve 339 is opened to provide for emptying of the contents of the reservoir 313 to the exhaust module 331. From time t7', the pressure within the reservoir 313 drops as the reservoir 313 is emptied in preparation for use. Through times t7 and t7', the pressure within the reservoir 311 continues to drop as the process gas composition A continues to be delivered at a steady flow rate and in an uninterrupted manner from the reservoir 311 to the process module 325 by way of the mass flow controller 315 and delivery control valve 319.

From time t8 to time t9, the gas delivery system 301 (and possibly the exhaust control valve 309) is operated to again establish a flow of process gas composition A within the common supply line 303. At time t9' (equal to time t9 or right after time t9), the exhaust control valve 309 is closed if open, and then the charge control valve 305 is opened to allow filling of the reservoir 311 from the common supply line 303 with process gas composition A. From time t9' to time t10, the pressure within the reservoir 311 rises as the reservoir 311 is filled with the process gas composition A. At time t10, the charge control valve 305 is closed. Then, at time t10' (equal to time t10 or right after time t10) the delivery of the process gas composition A from the gas delivery system 301 to the common supply line 303 is stopped. After the time t10, the pressure within the reservoir 311 drops as the process gas composition A continues to be delivered from the reservoir 311 to the process module 325 by way of the mass flow controller 315 and delivery control valve 319.

From time t11 to time t12, the gas delivery system 301 (and possibly the exhaust control valve 309) is operated to establish a flow of process gas composition C within the common supply line 303. At time t12' (equal to time t12 or right after time t12), the exhaust control valve 309 is closed if open, and then the charge control valve 307 is opened to allow filling of the reservoir 313 from the common supply line 303 with process gas composition C. From time t12' to time t13, the pressure within the reservoir 313 rises as the reservoir 313 is filled with the process gas composition C. At time t13, the charge control valve 307 is closed. Then, at time t13' (equal to time t13 or right after time t13) the delivery of the process gas composition C from the gas delivery system 301 to the common supply line 303 is stopped to allow for use of the common supply line 303 in filling the reservoir 311 with the process gas composition A. After the time t13, the pressure within the reservoir 313 holds steady as the reservoir 313 is in standby mode ready for use to deliver the process gas composition C to the process module 325. In some embodiments, a set point pressure can be defined to trigger refilling of the reservoir 311, and thereby allow the gas supply control module 400 to recognize reaching of the set point pressure within the reservoir 311 and in response stop the current filling of the reservoir 313 to allow for the immediately needed filling of the reservoir 311.

From time t14 to time t15, the gas delivery system 301 (and possibly the exhaust control valve 309) is operated to again establish a flow of process gas composition A within the common supply line 303. At time t15' (equal to time t15 or right after time t15), the exhaust control valve 309 is closed if open, and then the charge control valve 305 is opened to allow filling of the reservoir 311 from the common supply line 303 with process gas composition A. From time t15' to time t16, the pressure within the reservoir 311 rises as the reservoir 311 is filled with the process gas composition A. At time t16, the charge control valve 305 is closed. Then, at time t16' (equal to time t16 or right after time t16) the delivery of the process gas composition A from the gas delivery system 301 to the common supply line 303 is stopped. After the time t16, the pressure within the reservoir 311 drops as the process gas composition A continues to be delivered from the reservoir 311 to the process module 325 by way of the mass flow controller 315 and delivery control valve 319.

After completion of the fill cycle of reservoir 311 at time t16, the common supply line 303 can again be used to complete filling of the reservoir 313 with the process gas composition C. So, from time t17 to time t18, the gas delivery system 301 (and possibly the exhaust control valve 309) is operated to again establish a flow of process gas composition C within the common supply line 303. At time t18' (equal to time t18 or right after time t18), the exhaust control valve 309 is closed if open, and then the charge control valve 307 is opened to allow filling of the reservoir 313 from the common supply line 303 with process gas composition C. From time t18' to time t19, the pressure within the reservoir 313 rises as the reservoir 313 is filled with the process gas composition C. At time t19, the charge control valve 307 is closed. Then, at time t19' (equal to time t19 or right after time t19) the delivery of the process gas composition C from the gas delivery system 301 to the common supply line 303 is stopped. After the time t19, the pressure within the reservoir 313 holds steady as the reservoir 313 is in standby mode ready for use to deliver the process gas composition C to the process module 325.

From time t20 to time t21, the gas delivery system 301 (and possibly the exhaust control valve 309) is operated to again establish a flow of process gas composition A within the common supply line 303. At time t21' (equal to time t21 or right after time t21), the exhaust control valve 309 is closed if open, and then the charge control valve 305 is opened to allow filling of the reservoir 311 from the common supply line 303 with process gas composition A. From time t21' to time t22, the pressure within the reservoir 311 rises as the reservoir 311 is filled with the process gas composition A. At time t22, the charge control valve 305 is closed. Then, at time t22' (equal to time t22 or right after time t22) the delivery of the process gas composition A from the gas delivery system 301 to the common supply line 303 is stopped.

It should be understood that from time t0 to time t22, the process gas composition A is delivered at a steady flow rate and in an uninterrupted manner from the reservoir 311 through the mass flow controller 315 and delivery control valve 319 to the process module 325, even during the multiple refilling cycles of the reservoir 311, and during the preparation and filling of the reservoir 313. Then, at time t22, the delivery control valve 319 is closed and the delivery control valve 321 is opened, so as to cause a step change from delivery of the process gas composition A to delivery of the process gas composition C to the process module 325. In some embodiments, this step change in process gas composition can be done in a fraction of a second, on the order to 0.5 second or 0.1 second or even less. From the time t22, the pressure in the reservoir 313 drops as the process gas composition C is delivered from the reservoir 313 to the process module 325 by way of the mass flow controller 317 and delivery control valve 321. At time t22, the gas supply control module 400 recognizes that the next process step will use process gas composition A. Therefore, at time t22, the gas supply control module 400 operates to maintain the process gas composition A within the reservoir 311 by holding the pressure in the reservoir 311 steady.

In some embodiments, prior to the time t22, the exhaust control valve 343 can be opened and the mass flow controller 317 can be operated to established a uniform and stable flow of the process gas composition C within the connection lines extending from the reservoir 313 through the mass flow controller 317 to the delivery control valve 321. And, in these embodiments, at the time t22, or just prior to the time t22, the exhaust control valve 343 can be closed. In this manner, a uniform and stable flow of the process gas composition C can be delivered from the delivery control valve 321 as soon as the delivery control valve 321 is opened at time t22.

From time t23 to time t24, the gas delivery system 301 (and possibly the exhaust control valve 309) is operated to again establish a flow of process gas composition C within the common supply line 303. At time t24' (equal to time t24 or right after time t24), the exhaust control valve 309 is closed if open, and then the charge control valve 307 is opened to allow filling of the reservoir 313 from the common supply line 303 with process gas composition C. From time t24' to time t25, the pressure within the reservoir 313 rises as the reservoir 313 is filled with the process gas composition C. At time t25, the charge control valve 307 is closed. Then, at time t25' (equal to time t25 or right after time t25) the delivery of the process gas composition C from the gas delivery system 301 to the common supply line 303 is stopped. After the time t25, the pressure in the reservoir 313 drops as the process gas composition C is delivered from the reservoir 313 to the process module 325 by way of the mass flow controller 317 and delivery control valve 321.

At time t26, the delivery control valve 321 is closed and the delivery control valve 319 is opened, so as to cause a step change from delivery of the process gas composition C to delivery of the process gas composition A to the process module 325. In some embodiments, this step change in process gas composition can be done in a fraction of a second, on the order to 0.5 second or 0.1 second or even less. From the time t26, the pressure in the reservoir 311 drops as the process gas composition A is delivered from the reservoir 311 to the process module 325 by way of the mass flow controller 315 and delivery control valve 319. Also, from the time t26, the pressure in the reservoir 313 holds steady as no process gas is delivered from the reservoir 313. It should be understood that from time t22 to time t26, the process gas composition C is delivered at a steady flow rate and in an uninterrupted manner from the reservoir 313 through the mass flow controller 317 and delivery control valve 321 to the process module 325, even during the refilling cycle of the reservoir 313.

In some embodiments, prior to the time t26, the exhaust control valve 337 can be opened and the mass flow controller 315 can be operated to establish a uniform and stable flow of the process gas composition A within the connection lines extending from the reservoir 311 through the mass flow controller 315 to the delivery control valve 319. And, in these embodiments, at the time t26, or just prior to the time t26, the exhaust control valve 337 can be closed. In this manner, a uniform and stable flow of the process gas composition A can be delivered from the delivery control valve 319 as soon as the delivery control valve 319 is opened at time t26.

From time t27 to time t28, the gas delivery system 301 (and possibly the exhaust control valve 309) is operated to again establish a flow of process gas composition A within the common supply line 303. At time t28' (equal to time t28 or right after time t28), the exhaust control valve 309 is closed if open, and then the charge control valve 305 is opened to allow filling of the reservoir 311 from the common supply line 303 with process gas composition A. From time t28' to time t29, the pressure within the reservoir 311 rises as the reservoir 311 is filled with the process gas composition A. At time t29, the charge control valve 305 is closed. Then, at time t29' (equal to time t29 or right after time t29) the delivery of the process gas composition A from the gas delivery system 301 to the common supply line 303 is stopped.

It should be understood that the gas supply system 300 disclosed in FIG. 3 is provided by way of example. In other embodiments, the gas supply system 300 can be extended to include more than three reservoirs, with each reservoir having its own charge control valve (like 305, 307), mass flow controller (like 315, 317), delivery control valve (like 319, 321), and exhaust control valves (like 333, 337, 339, 343). For example, if the gas supply system 300 were extended to include three reservoirs, then the extended gas supply system would be able to provide for rapid alternation between delivery of three different process gas compositions to the process module 325 without having to evacuate a reservoir to receive a charge of a different process gas composition, which may improve scheduling of operations of the extended gas supply system. Also, as previously discussed, the gas supply system 300 can be used to provide for delivery of different process gas compositions to multiple delivery ports/zones of the process module 325, in addition to switching between delivery of different process gas compositions to the same delivery port/zone of the process module 325.

Additionally, it should be understood that the gas supply system 300 and gas supply control module 400 and scheduler module 401 and process input module 403 can be modified to provide for delivery of liquids to the process module 325. For example, methods for operating the gas supply system 300 to handle liquids can be similar to the methods disclosed herein for operating the gas supply system 300 to handle gases, except that instead of pressure being changed in constant volume reservoirs, storage tanks operating at substantially constant pressure can be used. In this manner, a liquid delivery system analogous to the gas delivery system 300 disclosed herein can be used to deliver process liquids to the process module 325.

Figure 8A:
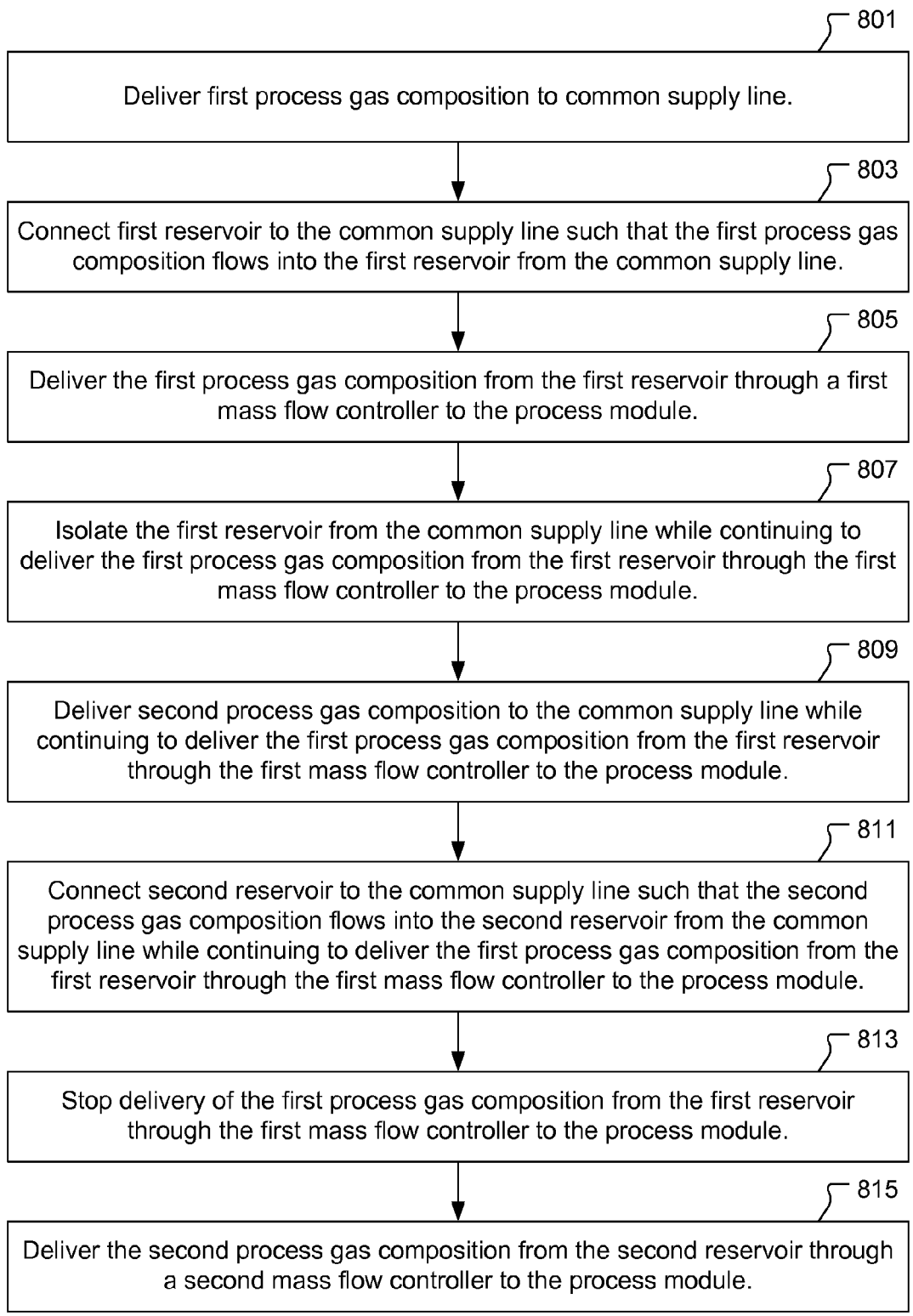
FIG. 8A shows a flowchart of a method for supplying process gas compositions to a process module utilizing the gas supply system, in accordance with some embodiments of the present invention.

FIG. 8A shows a flowchart of a method for supplying process gas compositions to a process module utilizing the gas supply system 300, in accordance with some embodiments of the present invention. The method includes an operation 801 for delivering a first process gas composition to a common supply line (303). In some embodiments, the first process gas composition is delivered to the common supply line (303) at a flow rate of about 1000 sccm or greater. The method also includes an operation 803 for connecting a first reservoir (311) to the common supply line (303) such that the first process gas composition flows into the first reservoir (311) from the common supply line (303). The method also includes an operation 805 for delivering the first process gas composition from the first reservoir (311) through a first mass flow controller (315) to the process module (325). The method also includes an operation 807 for isolating the first reservoir (311) from the common supply line (303) while continuing to deliver the first process gas composition from the first reservoir (311) through the first mass flow controller (315) to the process module (325). The method also includes an operation 809 for delivering a second process gas composition to the common supply line (303) while continuing to deliver the first process gas composition from the first reservoir (311) through the first mass flow controller (315) to the process module (303). In some embodiments, the second process gas composition is delivered to the common supply line (303) at a flow rate of about 1000 sccm or greater. The method also includes an operation 811 for connecting a second reservoir (313) to the common supply line (303) such that the second process gas composition flows into the second reservoir (313) from the common supply line (303) while continuing to deliver the first process gas composition from the first reservoir (311) through the first mass flow controller (315) to the process module (325).

The method also includes an operation 813 for stopping delivery of the first process gas composition from the first reservoir (311) through the first mass flow controller (315) to the process module (325). The method also includes an operation 815 for delivering the second process gas composition from the second reservoir (313) through a second mass flow controller (317) to the process module (325). In some embodiments, stopping delivery of the first process gas composition from the first reservoir (311) through the first mass flow controller (315) to the process module (325) in operation 813 and delivering the second process gas composition from the second reservoir (313) through the second mass flow controller (317) to the process module (325) in operation 815 occur at a substantially same time. In some embodiments, instead of the operation 813, the method can include an operation for delivering the first process gas composition from the first reservoir (311) through the first mass flow controller (315) to the process module (325) while also delivering the second process gas composition from the second reservoir (313) through the second mass flow controller (317) to the process module (325).

In some embodiments, the method can also include operations for calibrating the flow of the first process gas composition through the first mass flow controller (315). For example, the method can include an operation for determining an actual total flow rate of the first process gas composition into the common supply line (303). The method can also include an operation for measuring a total flow rate of the first process gas composition within the common supply line (303) using a mass flow meter (302) configured with equivalent mass flow measurement technology as present within each of the first and second mass flow controllers (315 and 317). Also, it should be noted that neither the mass flow meter (302) nor the first mass flow controller (315) is calibrated for accurate measurement of flow rate of the first process gas composition. The method can also include an operation for determining a calibration adjustment factor for the mass flow meter (302) for the first process gas composition by comparing the total flow rate of the first process gas composition within the common supply line (303) to the actual total flow rate of the first process gas composition into the common supply line (303). And, the method can include an operation for applying the calibration adjustment factor determined for the mass flow meter (302) for the first process gas composition to a flow rate of the first process gas composition as measured by the first mass flow controller (315) so as to obtain an accurate measure of the flow rate of the first process gas composition through the first mass flow controller (315) and enable use of the first mass flow controller (315) to accurately control the flow rate of the first process gas composition to the process module (325).

In some embodiments, the method can also include operations for calibrating the flow of the second process gas composition through the second mass flow controller (317). For example, the method can include an operation for determining an actual total flow rate of the second process gas composition into the common supply line (303). The method can also include an operation for measuring a total flow rate of the second process gas composition within the common supply line (303) using the mass flow meter (302) configured with equivalent mass flow measurement technology as present within each of the first and second mass flow controllers (315 and 317). It should be noted that neither the mass flow meter (302) nor the second mass flow controller (317) is calibrated for accurate measurement of flow rate of the second process gas composition. The method can also include an operation for determining a calibration adjustment factor for the mass flow meter (302) for the second process gas composition by comparing the total flow rate of the second process gas composition within the common supply line (303) to the actual total flow rate of the second process gas composition into the common supply line (303). The method can also include an operation for applying the calibration adjustment factor determined for the mass flow meter (302) for the second process gas composition to a flow rate of the second process gas composition as measured by the second mass flow controller (317) so as to obtain an accurate measure of the flow rate of the second process gas composition through the second mass flow controller (317) and enable use of the second mass flow controller (317) to accurately control the flow rate of the second process gas composition to the process module (325).

Figure 8B:
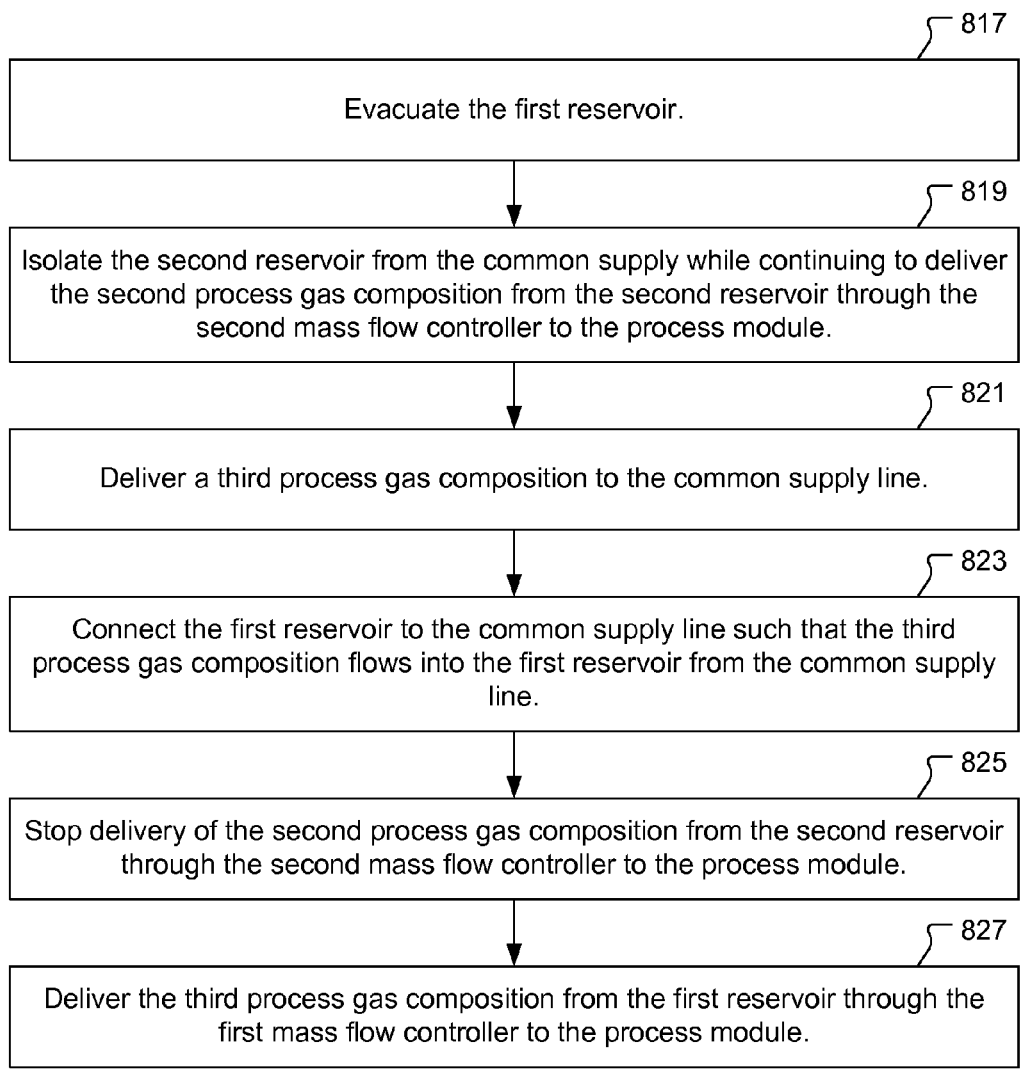
FIG. 8B shows a flowchart of a continuation of the method of FIG. 8A, in accordance with some embodiments of the present invention.

FIG. 8B shows a flowchart of a continuation of the method of FIG. 8A, in accordance with some embodiments of the present invention. The method includes an operation 817 for evacuating the first reservoir (311). The method also includes an operation 819 for isolating the second reservoir (313) from the common supply line (303) while continuing to deliver the second process gas composition from the second reservoir (313) through the second mass flow controller (317) to the process module (325). The method also includes an operation 821 for delivering a third process gas composition to the common supply line (303). In some embodiments, the third process gas composition is delivered to the common supply line (303) at a flow rate of about 1000 sccm or greater. The method also includes an operation 823 for connecting the first reservoir (311) to the common supply line (303) such that the third process gas composition flows into the first reservoir (311) from the common supply line (303). The method also includes an operation 825 for stopping delivery of the second process gas composition from the second reservoir (313) through the second mass flow controller (317) to the process module (325). The method also includes an operation 827 for delivering the third process gas composition from the first reservoir (311) through the first mass flow controller (315) to the process module (325). In some embodiments, stopping delivery of the second process gas composition from the second reservoir (313) through the second mass flow controller (317) to the process module (325) in operation 825 and delivering the third process gas composition from the first reservoir (311) through the first mass flow controller (319) to the process module (325) in operation 827 occur at a substantially same time.

In some embodiments, the method can also include operations for calibrating the flow of the third process gas composition through the first mass flow controller (315). For example, the method can include an operation for determining an actual total flow rate of the third process gas composition into the common supply line (303). The method also includes an operation for measuring a total flow rate of the third process gas composition within the common supply line (303) using the mass flow meter (302) configured with equivalent mass flow measurement technology as present within each of the first and second mass flow controllers (315 and 317). It should be noted that neither the mass flow meter (302) nor the first mass flow controller (315) is calibrated for accurate measurement of flow rate of the third process gas composition. The method also includes an operation for determining a calibration adjustment factor for the mass flow meter (302) for the third process gas composition by comparing the total flow rate of the third process gas composition within the common supply line (303) to the actual total flow rate of the third process gas composition into the common supply line (303). The method also includes an operation for applying the calibration adjustment factor determined for the mass flow meter (302) for the third process gas composition to a flow rate of the third process gas composition as measured by the first mass flow controller (315) so as to obtain an accurate measure of the flow rate of the third process gas composition through the first mass flow controller (315) and enable use of the first mass flow controller (315) to accurately control the flow rate of the third process gas composition to the process module (325).

Figure 9:
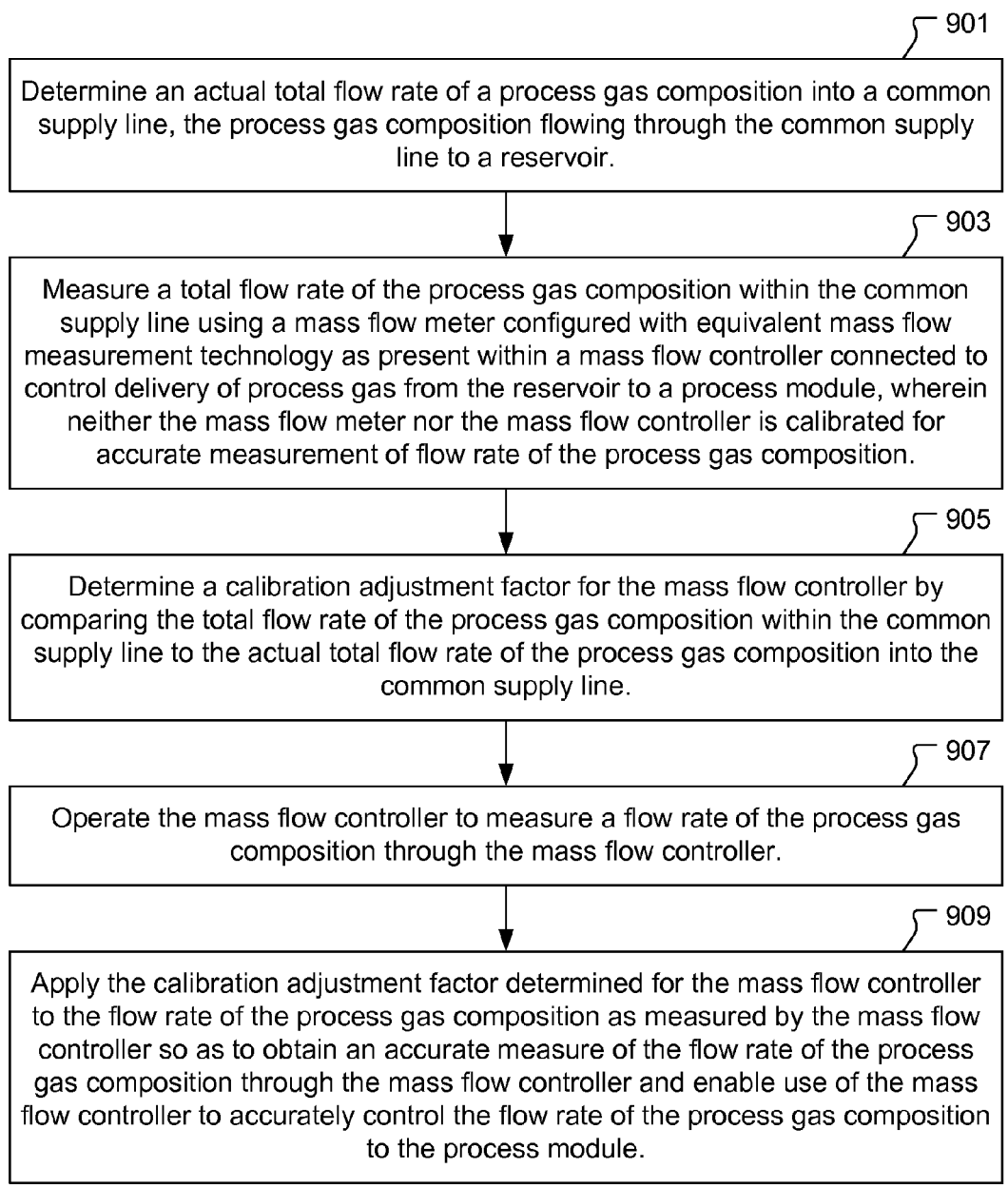
FIG. 9 shows a flowchart of a method for calibrating a gas supply system, in accordance with some embodiments of the present invention.

FIG. 9 shows a flowchart of a method for calibrating a gas supply system, such as the gas supply system 300, in accordance with some embodiments of the present invention. The method includes an operation 901 for determining an actual total flow rate of a process gas composition into a common supply line (300). The process gas composition flows through the common supply line (303) to a reservoir (311, 313). The method also includes an operation 903 for measuring a total flow rate of the process gas composition within the common supply line (303) using a mass flow meter (302) configured with equivalent mass flow measurement technology as present within a mass flow controller (315, 317) connected to control delivery of process gas from the reservoir (311, 313) to a process module (325). In should be noted that neither the mass flow meter (302) nor the mass flow controller (315, 317) is calibrated for accurate measurement of flow rate of the process gas composition. The method also includes an operation 905 for determining a calibration adjustment factor for the mass flow meter (302) for the process gas composition by comparing the total flow rate of the process gas composition within the common supply line (303) to the actual total flow rate of the process gas composition into the common supply line (303). The method also includes an operation 907 for operating the mass flow controller (315, 317) to measure a flow rate of the process gas composition through the mass flow controller (315, 317). The method also includes an operation 909 for applying the calibration adjustment factor determined for the mass flow meter (302) for the process gas composition to the flow rate of the process gas composition as measured by the mass flow controller (315, 317) so as to obtain an accurate measure of the flow rate of the process gas composition through the mass flow controller (315, 317) and enable use of the mass flow controller (315, 317) to accurately control the flow rate of the process gas composition to the process module (325). In some embodiments, the calibration adjustment factor is based on a ratio of the total flow rate of the process gas composition within the common supply line (303) as measured using the mass flow meter (302) to the actual total flow rate of the process gas composition into the common supply line (303).

Use of time-sharing/time-division of a process gas single delivery line, i.e., common supply line, from the single gas delivery system allows for the single gas delivery system to supply multiple different flows of different process gas compositions to the process module with a timing precision of less than 0.1 second between changes in process gas flow into the process module. It should be appreciated that the systems and methods disclosed herein avoid the need to provide multiple exit manifolds and/or multiple delivery lines from the gas delivery system to the process module, and avoids the need to use multiple mass flow controllers for the same process gas composition, among other provisions, which would reduce the process flexibility and increase the cost of a process tool.

Also, by way of the scheduling module disclosed as part of the systems and methods herein, it is possible to determine at what times to deliver particular process gas compositions from the gas delivery system to the local storage reservoirs, such that desired process gas composition flow rates to the process module can be maintained. Additionally, it should be appreciated that the system and method disclosed herein for in-use calibration of the mass flow controllers at the point of delivery to the process module allows for accurate dispensing of arbitrary mixtures of process gases from the local storage reservoirs. And, as a result, the process module, e.g., an etching system, which may need to provide 15 or more process gas compositions for various process steps, can be used with process gas composition switching times of less than 0.5 second, and in some cases less than 0.1 second, which are similar to process gas composition switching times that may be found in ALD processes.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A gas supply system for a process module, comprising:
   a gas delivery system configured to deliver different process gas compositions at specified times;
   a common supply line fluidly connected to the gas delivery system such that a given process gas composition delivered by the gas delivery system at a given time is flowed through the common supply line;
   a plurality of reservoirs fluidly connected to the common supply line;
   a plurality of charge control valves respectively corresponding to the plurality of reservoirs, each of the plurality of charge control valves connected to control starting and stopping of gas flow from the common supply line to its corresponding reservoir;
   a plurality of mass flow controllers respectively corresponding to the plurality of reservoirs, each of the plurality of mass flow controllers connected to control a flow rate of gas delivered from an outlet of its corresponding reservoir; and
   a plurality of delivery control valves respectively corresponding to the plurality of mass flow controllers, each of the plurality of delivery control valves connected to control starting and stopping of gas flow from an outlet of its corresponding mass flow controller to the process module.

2. The gas supply system for the process module as recited in claim 1, wherein each of the plurality of charge control valves is independently controllable, and wherein each of the plurality of mass flow controllers is independently operable, and wherein each of the plurality of delivery control valves is independently controllable.

3. The gas supply system for the process module as recited in claim 1, wherein each of the plurality of delivery control valves has a respective outlet fluidly connected to at least one process gas delivery port of the process module.

4. The gas supply system for the process module as recited in claim 1, wherein a first portion of the plurality of delivery control valves each has a respective outlet fluidly connected to a first set of one or more process gas delivery ports of the process module, and wherein a second portion of the plurality of delivery control valves each has a respective outlet fluidly connected to a second set of one or more process gas delivery ports of the process module.

5. The gas supply system for the process module as recited in claim 1, wherein each of the plurality of mass flow controllers is configured to operate under an inlet-to-outlet pressure differential condition of less than ⅓ atmosphere.

6. The gas supply system for the process module as recited in claim 1, wherein the gas delivery system is configured to deliver different process gas compositions through the common supply line at flow rates of about 1000 sccm (standard cubic centimeters) and greater.

7. The gas supply system for the process module as recited in claim 1, further comprising:
   a mass flow meter connected to measure a process gas flow rate within the common supply line.

8. The gas supply system for the process module as recited in claim 7, wherein the mass flow meter and each of the plurality of mass flow controllers are configured to measure mass flow in a same manner.

9. The gas supply system for the process module as recited in claim 8, wherein neither the mass flow meter nor the plurality of mass flow controllers are calibrated based on a process gas composition to be delivered from the gas delivery system to the common supply line.

10. The gas supply system for the process module as recited in claim 9, wherein the gas delivery system includes one or more mass flow controllers each configured to deliver a controlled flow rate of a given process gas at flow rates of about 1000 sccm (standard cubic centimeters) and greater.

11. The gas supply system for the process module as recited in claim 1, further comprising:
   an exhaust module;
   a first exhaust control valve connected to control starting and stopping of gas flow from the common supply line to the exhaust module;
   a first plurality of exhaust control valves respectively corresponding to the plurality of reservoirs, each of the first plurality of exhaust control valves connected to control starting and stopping of gas flow from the outlet of its corresponding reservoir to the exhaust module; and
   a second plurality of exhaust control valves respectively corresponding to the plurality of mass flow controllers, each of the second plurality of exhaust control valves connected to control starting and stopping of gas flow from the outlet of its corresponding mass flow controller to the exhaust module.

12. The gas supply system for the process module as recited in claim 11, further comprising:
   a gas supply control module configured to control operation of the gas delivery system, the plurality of charge control valves, the plurality of mass flow controllers, the plurality of delivery control valves, the exhaust module, the first exhaust control valve, the first plurality of exhaust control valves, and the second plurality of exhaust control valves.

13. The gas supply system for the process module as recited in claim 12, further comprising:
a scheduler module configured to direct operation of the gas supply control module, the scheduler module configured to provide input to the gas supply control module with regard to timing of operation of components within the gas supply system.

14. A method for supplying process gas compositions to a process module, comprising:
having a gas supply system for the process module, the gas supply system including—
a gas delivery system configured to deliver different process gas compositions at specified times,
a common supply line fluidly connected to the gas delivery system such that a given process gas composition delivered by the gas delivery system at a given time is flowed through the common supply line,
a plurality of reservoirs fluidly connected to the common supply line,
a plurality of charge control valves respectively corresponding to the plurality of reservoirs, each of the plurality of charge control valves connected to control starting and stopping of gas flow from the common supply line to its corresponding reservoir,
a plurality of mass flow controllers respectively corresponding to the plurality of reservoirs, each of the plurality of mass flow controllers connected to control a flow rate of gas delivered from an outlet of its corresponding reservoir, and
a plurality of delivery control valves respectively corresponding to the plurality of mass flow controllers, each of the plurality of delivery control valves connected to control starting and stopping of gas flow from an outlet of its corresponding mass flow controller to the process module;
delivering a first process gas composition to the common supply line from the gas delivery system;
connecting a first reservoir of the plurality of reservoirs to the common supply line such that the first process gas composition flows into the first reservoir from the common supply line;
delivering the first process gas composition from the first reservoir through a first mass flow controller of the plurality of mass flow controllers to the process module;
isolating the first reservoir from the common supply line while continuing to deliver the first process gas composition from the first reservoir through the first mass flow controller to the process module;
delivering a second process gas composition to the common supply line from the gas delivery system while continuing to deliver the first process gas composition from the first reservoir through the first mass flow controller to the process module;
connecting a second reservoir of the plurality of reservoirs to the common supply line such that the second process gas composition flows into the second reservoir from the common supply line while continuing to deliver the first process gas composition from the first reservoir through the first mass flow controller to the process module;

stopping delivery of the first process gas composition from the first reservoir through the first mass flow controller to the process module; and
delivering the second process gas composition from the second reservoir through a second mass flow controller of the plurality of mass flow controllers to the process module.

15. The method for supplying process gas compositions to the process module as recited in claim 14, wherein stopping delivery of the first process gas composition from the first reservoir through the first mass flow controller to the process module and delivering the second process gas composition from the second reservoir through the second mass flow controller to the process module occur at a substantially same time.

16. The method for supplying process gas compositions to the process module as recited in claim 14, wherein each of the first process gas composition and the second process gas composition is delivered to the common supply line at a flow rate of about 1000 sccm (standard cubic centimeters) or greater.

17. The method for supplying process gas compositions to the process module as recited in claim 14, further comprising:
determining an actual total flow rate of the first process gas composition into the common supply line from the gas delivery system;
measuring a total flow rate of the first process gas composition within the common supply line using a mass flow meter configured to measure mass flow in a same manner as each of the first and second mass flow controllers, wherein neither the mass flow meter nor the first mass flow controller is calibrated for accurate measurement of flow rate of the first process gas composition;
determining a calibration adjustment factor for the mass flow meter for the first process gas composition by comparing the total flow rate of the first process gas composition within the common supply line to the actual total flow rate of the first process gas composition into the common supply line from the gas delivery system; and
applying the calibration adjustment factor determined for the mass flow meter for the first process gas composition to a flow rate of the first process gas composition as measured by the first mass flow controller so as to obtain an accurate measure of the flow rate of the first process gas composition through the first mass flow controller and enable use of the first mass flow controller to accurately control the flow rate of the first process gas composition to the process module.

18. The method for supplying process gas compositions to the process module as recited in claim 17, further comprising:
determining an actual total flow rate of the second process gas composition into the common supply line from the gas delivery system;
measuring a total flow rate of the second process gas composition within the common supply line using the mass flow meter configured to measure mass flow in a same manner as each of the first and second mass flow controllers, wherein neither the mass flow meter nor the second mass flow controller is calibrated for accurate measurement of flow rate of the second process gas composition;
determining a calibration adjustment factor for the mass flow meter for the second process gas composition by comparing the total flow rate of the second process gas composition within the common supply line to the actual total flow rate of the second process gas composition into the common supply line from the gas delivery system; and applying the calibration adjustment factor determined for the mass flow meter for the second process gas composition to a flow rate of the second process gas composition as measured by the second mass flow controller so as to obtain an accurate measure of the flow rate of the second process gas composition through the second mass flow controller and enable use of the second mass flow controller to accurately control the flow rate of the second process gas composition to the process module.

19. The method for supplying process gas compositions to the process module as recited in claim 14, further comprising:

evacuating the first reservoir;
isolating the second reservoir from the common supply line while continuing to deliver the second process gas composition from the second reservoir through the second mass flow controller to the process module;
delivering a third process gas composition to the common supply line from the gas delivery system;
connecting the first reservoir to the common supply line such that the third process gas composition flows into the first reservoir from the common supply line;
stopping delivery of the second process gas composition from the second reservoir through the second mass flow controller to the process module; and
delivering the third process gas composition from the first reservoir through the first mass flow controller to the process module.

20. The method for supplying process gas compositions to the process module as recited in claim 19, wherein stopping delivery of the first process gas composition from the first reservoir through the first mass flow controller to the process module and delivering the second process gas composition from the second reservoir through the second mass flow controller to the process module occur at a first substantially same time, and wherein stopping delivery of the second process gas composition from the second reservoir through the second mass flow controller to the process module and delivering the third process gas composition from the first reservoir through the first mass flow controller to the process module occur at a second substantially same time.

21. The method for supplying process gas compositions to the process module as recited in claim 19, wherein each of the first process gas composition, the second process gas composition, and the third process gas composition is delivered to the common supply line at a flow rate of about 1000 sccm (standard cubic centimeters) or greater.

22. The method for supplying process gas compositions to the process module as recited in claim 19, further comprising:

determining an actual total flow rate of the third process gas composition into the common supply line from the gas delivery system;
measuring a total flow rate of the third process gas composition within the common supply line using a mass flow meter configured to measure mass flow in a same manner as each of the first and second mass flow controllers, wherein neither the mass flow meter nor the first mass flow controller is calibrated for accurate measurement of flow rate of the third process gas composition;

determining a calibration adjustment factor for the mass flow meter for the third process gas composition by comparing the total flow rate of the third process gas composition within the common supply line to the actual total flow rate of the third process gas composition into the common supply line from the gas delivery system; and applying the calibration adjustment factor determined for the mass flow meter for the third process gas composition to a flow rate of the third process gas composition as measured by the first mass flow controller so as to obtain an accurate measure of the flow rate of the third process gas composition through the first mass flow controller and enable use of the first mass flow controller to accurately control the flow rate of the third process gas composition to the process module.

23. The method for supplying process gas compositions to the process module as recited in claim 14, further comprising:

delivering the first process gas composition from the first reservoir through the first mass flow controller to the process module while also delivering the second process gas composition from the second reservoir through the second mass flow controller to the process module.

24. A method for calibrating a gas supply system, comprising:

having the gas supply system, the gas supply system including—
a gas delivery system configured to deliver different process gas compositions at specified times,
a common supply line fluidly connected to the gas delivery system such that a given process gas composition delivered by the gas delivery system at a given time is flowed through the common supply line,
a plurality of reservoirs fluidly connected to the common supply line,
a plurality of charge control valves respectively corresponding to the plurality of reservoirs, each of the plurality of charge control valves connected to control starting and stopping of gas flow from the common supply line to its corresponding reservoir,
a plurality of mass flow controllers respectively corresponding to the plurality of reservoirs, each of the plurality of mass flow controllers connected to control a flow rate of gas delivered from an outlet of its corresponding reservoir, and
a plurality of delivery control valves respectively corresponding to the plurality of mass flow controllers, each of the plurality of delivery control valves connected to control starting and stopping of gas flow from an outlet of its corresponding mass flow controller to a process module;

determining an actual total flow rate of a process gas composition into the common supply line from the gas delivery system, the process gas composition flowing through the common supply line to a selected reservoir of the plurality of reservoirs;

measuring a total flow rate of the process gas composition within the common supply line using a mass flow meter configured to measure mass flow in a same manner as a selected mass flow controller of the plurality of mass flow controllers connected to control delivery of process gas from the selected reservoir to the process module, wherein neither the mass flow meter nor the selected mass flow controller is calibrated for accurate measurement of flow rate of the process gas composition;

determining a calibration adjustment factor for the mass flow meter for the process gas composition by comparing the total flow rate of the process gas composition within the common supply line as measured by the mass flow meter to the actual total flow rate of the process gas composition into the common supply line from the gas delivery system;

operating the selected mass flow controller to measure a flow rate of the process gas composition through the selected mass flow controller; and applying the calibration adjustment factor determined for the mass flow meter for the process gas composition to the flow rate of the process gas composition as measured by the selected mass flow controller so as to obtain an accurate measure of the flow rate of the process gas composition through the selected mass flow controller and enable use of the selected mass flow controller to accurately control the flow rate of the process gas composition to the process module.

25. The method for calibrating the gas supply system as recited in claim 24, wherein the calibration adjustment factor is based on a ratio of the total flow rate of the process gas composition within the common supply line as measured using the mass flow meter to the actual total flow rate of the process gas composition into the common supply line from the gas delivery system.

* * * * *